US011081807B2

(12) United States Patent
Jong et al.

(10) Patent No.: US 11,081,807 B2
(45) Date of Patent: Aug. 3, 2021

(54) ELECTRONIC DEVICE COMPRISING ARRAY ANTENNA

(71) Applicant: Samsung Electronics Co., Ltd., Gyeonggi-do (KR)

(72) Inventors: Je Hun Jong, Seoul (KR); Se Hyun Park, Gyeonggi-do (KR); Tae Young Kim, Gyeonggi-do (KR); Ahmed Hussain, Gyeonggi-do (KR); Su Min Yun, Incheon (KR); Igor Shcherbatko, Gyeonggi-do (KR); In Young Lee, Gyeonggi-do (KR); Jin Woo Jung, Seoul (KR); Jae Hoon Jo, Gyeonggi-do (KR); Kuo Cheng Chen, Gyeonggi-do (KR); Jae Bong Chun, Gyeonggi-do (KR)

(73) Assignee: Samsung Electronics Co., Ltd

( * ) Notice: Subject to any disclaimer, the term of this patent is extended or adjusted under 35 U.S.C. 154(b) by 87 days.

(21) Appl. No.: 16/035,019

(22) Filed: Jul. 13, 2018

(65) Prior Publication Data

US 2019/0020100 A1 Jan. 17, 2019

(30) Foreign Application Priority Data

Jul. 13, 2017 (KR) ........................ 10-2017-0089099

(51) Int. Cl.

*H01Q 21/06* (2006.01)
*H01Q 1/24* (2006.01)

(Continued)

(52) U.S. Cl.

CPC ........... *H01Q 21/065* (2013.01); *H01Q 1/243* (2013.01); *H01Q 1/48* (2013.01); *H01Q 1/523* (2013.01); *H01Q 15/006* (2013.01); *H01Q 21/22* (2013.01)

(58) Field of Classification Search

CPC .... H01Q 15/006; H01Q 1/2283; H01Q 1/243; H01Q 1/523; H01L 23/66; H01L 2223/6677

See application file for complete search history.

(56) References Cited

U.S. PATENT DOCUMENTS

| | | | |
|---|---|---|---|
| 6,384,793 | B2 | 5/2002 | Scordilis |
| 7,595,522 | B2 | 9/2009 | Takeuchi |

(Continued)

FOREIGN PATENT DOCUMENTS

| | | |
|---|---|---|
| CN | 102754274 | 10/2012 |
| CN | 102754276 | 10/2012 |

(Continued)

OTHER PUBLICATIONS

European Search Report dated Nov. 27, 2018 issued in counterpart application No. 18183538.0-1205, 9 pages.

(Continued)

*Primary Examiner* — Robert Karacsony

(74) *Attorney, Agent, or Firm* — The Farrell Law Firm, P.C.

(57) ABSTRACT

An antenna device is provided and includes a plurality of antenna radiators arranged in an array, a ground member in operable communication with the plurality of antenna radiators, a plurality of conductive cells arranged on the plurality of antenna radiators, and a plurality of feeding lines electrically connected to the plurality of antenna radiators.

20 Claims, 21 Drawing Sheets

(51) Int. Cl.

| | |
|---|---|
| ***H01Q 1/48*** | (2006.01) |
| ***H01Q 21/22*** | (2006.01) |
| ***H01Q 15/00*** | (2006.01) |
| ***H01Q 1/52*** | (2006.01) |

(56) References Cited

U.S. PATENT DOCUMENTS

| | | | | |
|---|---|---|---|---|
| 7,838,404 | B2 | 11/2010 | Takeuchi | |
| 8,134,199 | B2 | 3/2012 | Takeuchi | |
| 8,344,442 | B2 | 1/2013 | Takeuchi | |
| 9,000,997 | B2 | 4/2015 | Ando | |
| 9,323,877 | B2 | 4/2016 | Ng et al. | |
| 9,350,078 | B2 | 5/2016 | Ando et al. | |
| 9,825,357 | B2 | 11/2017 | Parsche | |
| 9,853,485 | B2 | 12/2017 | Contopanagos | |
| 10,177,594 | B2 | 1/2019 | Contopanagos | |
| 2001/0015705 | A1 | 8/2001 | Scordilis | |
| 2007/0080864 | A1 | 4/2007 | Channabasappa | |
| 2007/0126046 | A1 | 6/2007 | Takeuchi | |
| 2009/0079637 | A1* | 3/2009 | Fukui | H01Q 11/04 343/700 MS |
| 2009/0305491 | A1 | 12/2009 | Takeuchi | |
| 2011/0042737 | A1 | 2/2011 | Takeuchi | |
| 2011/0199273 | A1 | 8/2011 | Kim et al. | |
| 2012/0132980 | A1 | 5/2012 | Takeuchi | |
| 2012/0242556 | A1 | 9/2012 | Ando | |
| 2012/0287000 | A1 | 11/2012 | Ando et al. | |
| 2015/0130673 | A1 | 5/2015 | Ng et al. | |
| 2016/0087333 | A1* | 3/2016 | Tong | H01Q 1/40 343/873 |
| 2016/0104934 | A1 | 4/2016 | Jang et al. | |
| 2016/0211586 | A1 | 7/2016 | Hong et al. | |
| 2016/0351996 | A1* | 12/2016 | Ou | H01Q 13/02 |
| 2018/0233465 | A1* | 8/2018 | Spella | H01L 23/528 |
| 2019/0333882 | A1* | 10/2019 | Kamgaing | H01Q 19/005 |

FOREIGN PATENT DOCUMENTS

| | | |
|---|---|---|
| CN | 105938940 | 9/2016 |
| CN | 205564995 | 9/2016 |
| EP | 1 775 795 | 4/2007 |
| EP | 3 166 205 | 5/2017 |
| KR | 1020100046579 | 5/2010 |
| KR | 10-1147939 | 5/2012 |
| KR | 1020160042740 | 4/2016 |

OTHER PUBLICATIONS

International Search Report dated Nov. 7, 2018 issued in counterpart application No. PCT/KR2018/007968, 11 pages.

Daniel Frederic Sievenpiper, "High-Impedance Electromagnetic Surfaces", University of California, Los Angeles, pp. 1-150, 1999.

Chinese Office Action dated Mar. 4, 2020 issued in counterpart application No. 201810768243.8, 8 pages.

Korean Office Action dated Jun. 14, 2021 issued in counterpart application No. 10-2017-0089099, 10 pages.

* cited by examiner

ELECTRONIC DEVICE COMPRISING ARRAY ANTENNA

CROSS-REFERENCE TO RELATED APPLICATION(S)

This application is based on and claims priority under 35 U.S.C. § 119(a) to Korean Patent Application Serial No. 10-2017-0089099, which was filed on Jul. 13, 2017, in the Korean Intellectual Property Office, the entire disclosure of which is incorporated herein by reference.

BACKGROUND

1. Field

The present disclosure relates, generally, to an electronic device, and more particularly, to an electronic device including an antenna array.

2. Description of Related Art

Fifth generation mobile communication (5G) technology based on an extremely high frequency band of 28 GHz or more is currently being developed. A signal of the extremely high frequency band includes a millimeter wave having a frequency band of 30 GHz to 300 GHz. Typically, an electronic device that uses such an extremely high frequency band, a wavelength of which is short, are relatively small and/or light when compared to other electronic devices that do not use such a frequency band, and a relatively large number of antennas may be mounted on the same area of the electronic device. On the other hand, since a directivity of the radio waves emitted from the electronic device are strong, unacceptable propagation path loss can occur, and the propagation characteristics may deteriorate. Therefore, recent technology that is configured for increasing the transmission/reception efficiency of the antenna of the electronic device has been used, i.e., by concentrating transmission/reception power in a narrow space of the electronic device.

The above information is presented as background information only to assist with an understanding of the present disclosure. No determination has been made, and no assertion is made, as to whether any of the above might be applicable as prior art with regard to the present disclosure.

SUMMARY

When a patch antenna array is employed to transmit and receive millimeter waves, a bandwidth may be narrowed, the gain may be lowered, the radiation angle may be narrowed, and the performance of an antenna may be reduced due to the coupling between patch antennas. When a spacer is used to widen the bandwidth, the volume of the antenna may increase and the mass production of the antenna may become difficult. When an inductive loaded antenna is used to increase the gain, the bandwidth may be narrowed.

The disclosure has been made to address at least the disadvantages described above and to provide at least the advantages described below. Accordingly, an aspect of the disclosure provides an antenna array that increases a bandwidth, a gain, a radiation angle, and decreases the coupling between antennas.

In accordance with an aspect of the disclosure, an antenna device is provided. The antenna device includes a plurality of antenna radiators arranged in an array, a ground member in operable communication with the plurality of antenna radiators, a plurality of conductive cells arranged on the plurality of antenna radiators, and a plurality of feeding lines electrically connected to the plurality of antenna radiators.

In accordance with an aspect of the disclosure, an electronic device is provided. The electronic device includes an antenna array including a plurality of antenna radiators disposed in an array, a ground member in operable communication with the plurality of antenna radiators, a plurality of conductive cells arranged above the plurality of antenna radiators, and a plurality of feeding lines electrically connected to the plurality of antenna radiators, and a communication circuit electrically connected to the plurality of feeding lines.

In accordance with an aspect of the disclosure, an electronic device is provided. The electronic device includes a housing including a front plate, a back plate, and a side member, an antenna assembly including a first layer including a ground plane parallel to the back plate, a second layer including a first region including a repeating pattern of conductive islands, and a second region surrounded at least partly by the first region; a third layer including a non-conductive layer interposed between the first layer and the second layer, and a first conductive pattern embedded in the third layer to overlap the second region, and a wireless communication circuit electrically connected to the first conductive pattern and configured to provide a signal with a frequency range between 20 GHz and 80 GHz.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
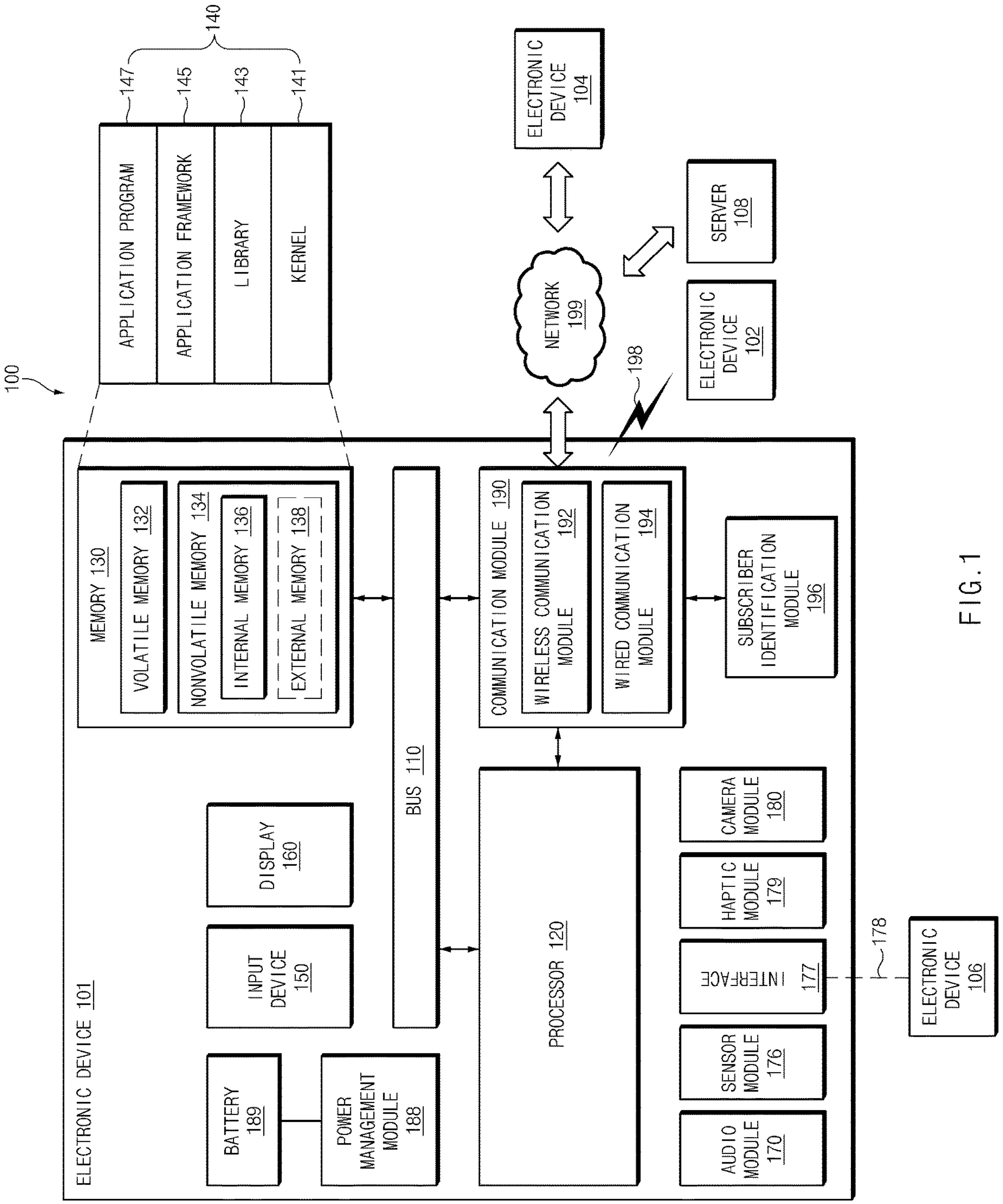
FIG. 1 is a diagram of an electronic device in a network environment, according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may use corresponding components regardless of importance or an order and are used to distinguish a component from another without limiting the components. These terms may be used for the purpose of distinguishing one element from another element. For example, a first user device and a second user device may indicate different user devices regardless of the order or importance. For example, a first element may be referred to as a second element without departing from the scope the disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the disclosure may include at least one of an application-specific integrated circuit (ASIC) chip, a field-programmable gate array (FPGA), and a programmable-logic device for performing operations which has been known or are to be developed hereinafter.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" may indicate a person using an electronic device or a device (e.g., an artificial intelligence electronic device) using an electronic device.

FIG. 1 is a diagram of an electronic device 101 in a network environment 100, according to an embodiment. The electronic device 101 may be embodied in various types of devices, as described above.

Referring to FIG. 1, under the network environment 100, the electronic device 101 may communicate with an electronic device 102 through local wireless communication 198 or may communicate with an electronic device 104 or a server 108 through a network 199. The electronic device 101 may communicate with the electronic device 104 through the server 108.

The electronic device 101 may include a bus 110, a processor 120, a memory 130, an input device 150 (e.g., a microphone or a mouse), a display 160, an audio module 170, a sensor module 176, an interface 177, a haptic module 179, a camera module 180, a power management module 188, a battery 189, a communication module 190, and a subscriber identification module (SIM) 196. The electronic device 101 may not include at least one of the above-described elements or may further include other element(s).

The bus 110 may interconnect the above-described elements 120 to 190 and may include a circuit for conveying signals (e.g., a control message or data) between the above-described elements.

The processor 120 may include one or more CPUs, APs, a graphic processing unit (GPU), and an image signal processor (ISP) of a camera or communication processors (CPs). The processor 120 may be implemented with a system on chip (SoC) or a system in package (SiP). The processor 120 may drive an operating system (OS) or an application to control at least one of another element (e.g., hardware or software element) connected to the processor 120 and may process and compute various data. The processor 120 may load a command or data, which is received from at least one of other elements (e.g., the communication module 190), into a volatile memory 132 to process the command or data and may store the process result data into a nonvolatile memory 134.

The memory 130 may include the volatile memory 132 or the nonvolatile memory 134. The volatile memory 132 may include a random access memory (RAM) (e.g., a dynamic RAM (DRAM), a static RAM (SRAM), or a synchronous dynamic RAM (SDRAM)). The nonvolatile memory 134 may include a one-time programmable read-only memory (OTPROM), a programmable read-only memory (PROM), an erasable programmable read-only memory (EPROM), an electrically erasable programmable read-only memory (EEPROM), a mask ROM, a flash ROM, a flash memory, a hard disk drive, or a solid-state drive (SSD). The nonvolatile memory 134 may be configured in the form of an internal memory 136 or the form of an external memory 138 which is available through connection only if necessary, according to the connection with the electronic device 101. The external memory 138 may further include a flash drive such as compact flash (CF), secure digital (SD), micro secure digital (Micro-SD), mini secure digital (Mini-SD), extreme digital (xD), a multimedia card (MMC), or a memory stick. The external memory 138 may be operatively or physically connected with the electronic device 101 in a wired manner (e.g., a cable or a universal serial bus (USB)) or a wireless (e.g., Bluetooth (BT)) manner.

The memory 130 may store at least one different software element, such as an instruction or data associated with the program 140, of the electronic device 101. The program 140 may include a kernel 141, a library 143, an application framework 145 or an application program (application) 147.

The input device 150 may include a microphone, a mouse, or a keyboard. The keyboard may include a keyboard physically connected or a keyboard virtually displayed through the display 160.

The display 160 may include a hologram device or a projector, and a control circuit to control a relevant device. The screen may include a liquid crystal display (LCD), a light emitting diode (LED) display, an organic LED (OLED) display, a microelectromechanical systems (MEMS) display, or an electronic paper display. The display 160 may be flexible, transparent, or wearable. The display 160 may include a touch circuitry, which is able to detect a user's input such as a gesture input, a proximity input, or a hovering input or a pressure sensor (a force sensor) which is able to measure the intensity of the pressure by the touch. The touch circuit or the pressure sensor may be implemented integrally with the display 160 or may be implemented with at least one sensor separately from the display 160. The hologram device may show a stereoscopic image in a space using interference of light. The projector may project light onto a screen to display an image. The screen may be located inside or outside the electronic device 101.

The audio module 170 may convert an electrical signal, or from an electrical signal, into sound. The audio module 170 may obtain sound through the input device 150 (e.g., a microphone) and may output sound through an output device (e.g., a speaker or a receiver) included in the electronic device 101, or through the electronic device 102 (e.g., a wireless speaker or a wireless headphone) or an electronic device 106 (e.g., a wired speaker or a wired headphone) connected with the electronic device 101.

The sensor module 176 may measure or detect an internal operating state (e.g., power or temperature) or an external environment state (e.g., an altitude, a humidity, or brightness) of the electronic device 101 to generate an electrical signal or a data value corresponding to the information of the measured state or the detected state. The sensor module 176 may include at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint senor, a heartbeat rate monitoring (HRM) sensor, an e-nose sensor, an electromyography (EMG) sensor, an electroencephalogram (EEG) sensor, an electrocardiogram (ECG) sensor, a temperature sensor, a humidity sensor, an illuminance sensor, or an UV sensor. The sensor module 176 may further include a control circuit for controlling at least one or more sensors included therein. The electronic device 101 may control the sensor module 176 by using the processor 120 or a processor (e.g., a sensor hub) separate from the processor 120. When the separate processor is used, while the processor 120 is in a sleep state, the electronic device 101 may control at least part of the operation or the state of the sensor module 176 by the operation of the separate processor without awakening the processor 120.

The interface 177 may include a high definition multimedia interface (HDMI), a USB, an optical interface, a recommended standard 232 (RS-232), a D-subminiature (D-sub), a mobile high-definition link (MHL) interface, a SD card/MMC interface, or an audio interface. A connector 178 may physically connect the electronic device 101 and the electronic device 106. The connector 178 may include a USB connector, an SD card/MMC connector, or an audio connector (e.g., a headphone connector).

The haptic module 179 may convert an electrical signal into mechanical stimulation (e.g., vibration or motion) or into electrical stimulation. The haptic module 179 may apply tactile or kinesthetic stimulation to a user. The haptic module 179 may include a motor, a piezoelectric element, or an electric stimulator.

The camera module 180 may capture a still image and a moving picture. The camera module 180 may include at least one lens (e.g., a wide-angle lens and a telephoto lens, or a front lens and a rear lens), an image sensor, an image signal processor, or a flash (e.g., an LED or a xenon lamp).

The power management module 188, which is used to manage the power of the electronic device 101, may constitute at least a portion of a power management integrated circuit (PMIC).

The battery 189 may include a primary cell, a secondary cell, or a fuel cell and may be recharged by an external power source to supply power at least one element of the electronic device 101.

The communication module 190 may establish a communication channel between the electronic device 101 and the first external electronic device 102, the second external electronic device 104, or the server 108. The communication module 190 may support wired communication or wireless communication through the established communication channel. The communication module 190 may include a wireless communication module 192 or a wired communication module 194. The communication module 190 may communicate with an external device through a first network 198 (e.g. a wireless local area network such as BT or according to the Infrared Data Association (IrDA) standard) or a second network 199 (e.g., a wireless wide area network such as a cellular network) through a relevant module among the wireless communication module 192 or the wired communication module 194.

The wireless communication module 192 may support cellular communication, local wireless communication, and global navigation satellite system (GNSS) communication. The cellular communication may include long-term evolution (LTE), LTE Advance (LTE-A), code division multiple access (CMA), wideband CDMA (WCDMA), universal mobile telecommunications system (UMTS), wireless broadband (WiBro), or global system for mobile communications (GSM). The local wireless communication may include wireless-fidelity (Wi-Fi), Wi-Fi Direct, light fidelity (Li-Fi), BT, BT low energy (BLE), Zigbee, near field communication (NFC), magnetic secure transmission (MST), radio frequency (RF), or a body area network (BAN). The GNSS may include at least one of a GPS, a global navigation satellite system (Glonass), Beidou Navigation Satellite System (Beidou), the European global satellite-based navigation system (Galileo), or the like; GPS and GNSS may be interchangeably used.

When the wireless communication module 192 supports cellar communication, the wireless communication module 192 may identify or authenticate the electronic device 101 within a communication network using the SIM 196. The wireless communication module 192 may include a CP separate from the processor 120 (e.g., an AP. The communication processor may perform at least a portion of functions associated with at least one of elements 110 to 196 of the electronic device 101 in place of the processor 120 when the processor 120 is in an inactive (sleep) state, and together with the processor 120 when the processor 120 is in an active state. The wireless communication module 192 may include a plurality of communication modules, each supporting only a relevant communication scheme among cellular communication, short-range wireless communication, or a GNSS communication scheme.

The wired communication module 194 may include a local area network (LAN) service, a power line communication, or a plain old telephone service (POTS).

The first network 198 may employ Wi-Fi direct or BT for transmitting or receiving instructions or data through wireless direct connection between the electronic device 101 and the first external electronic device 102. The second network 199 may include a telecommunication network (e.g., a computer network such as a LAN or a WAN, the Internet or a telephone network) for transmitting or receiving instructions or data between the electronic device 101 and the second electronic device 104.

The instructions or the data may be transmitted or received between the electronic device 101 and the second external electronic device 104 through the server 108 connected with the second network 199. Each of the external first and second external electronic devices 102 and 104 may be a device that different from or the same as that of the electronic device 101. All or a part of operations that the electronic device 101 will perform may be executed by the electronic devices 102 and 104 or the server 108. When the electronic device 101 executes any function or service automatically or in response to a request, the electronic device 101 may not perform the function or the service internally, but may alternatively or additionally transmit requests for at least a part of a function associated with the electronic device 101 to the electronic device 102 or 104 or the server 108. The electronic device 102 or 104 or the server 108 may execute the requested function or additional function and may transmit the execution result to the electronic device 101. The electronic device 101 may provide the requested function or service using the received result or may additionally process the received result to provide the requested function or service. To this end, cloud computing, distributed computing, or client-server computing may be used.

Figure 2:
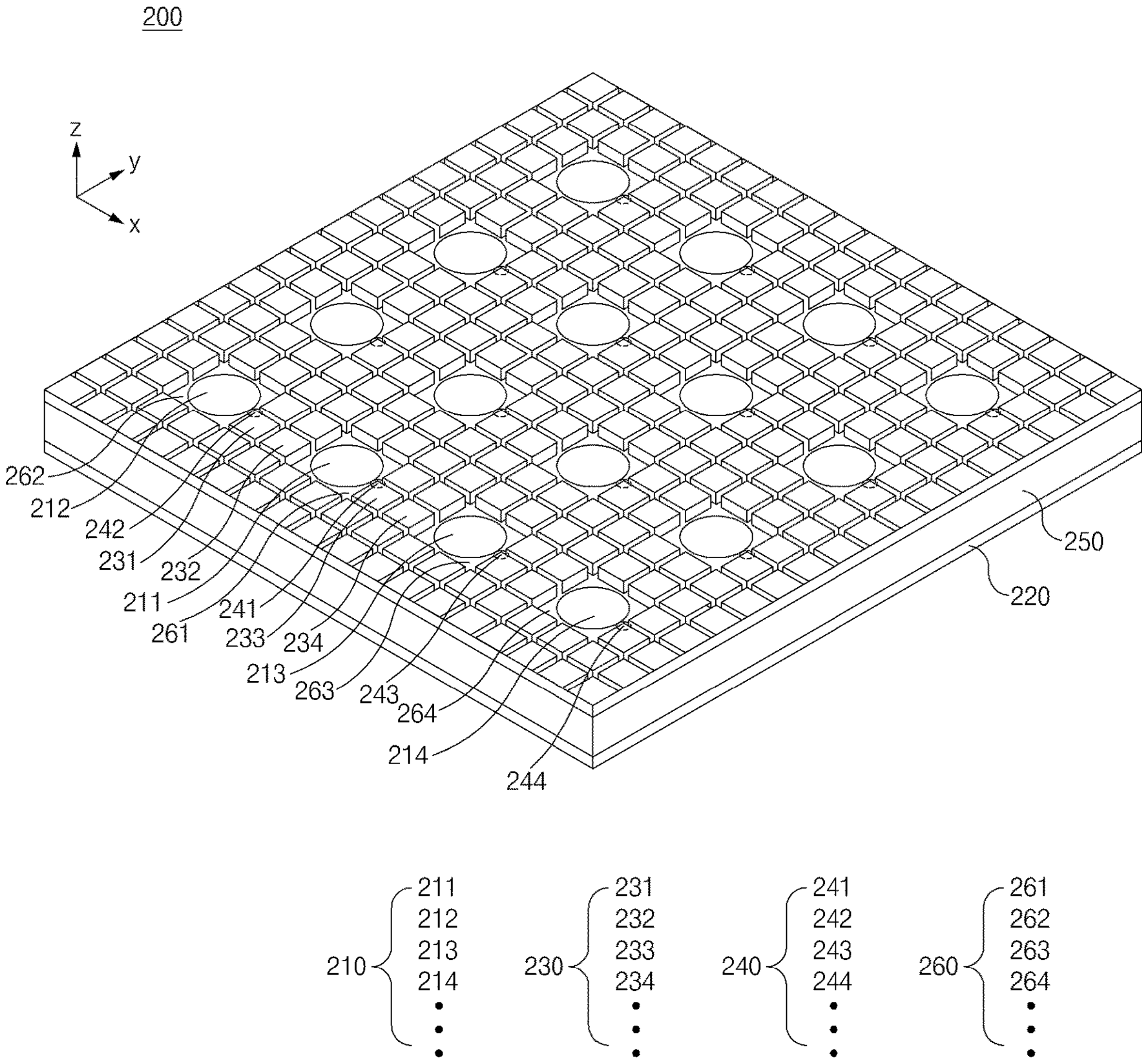
FIG. 2 is a diagram an antenna device included in an electronic device, according to an embodiment.
Figure 3:
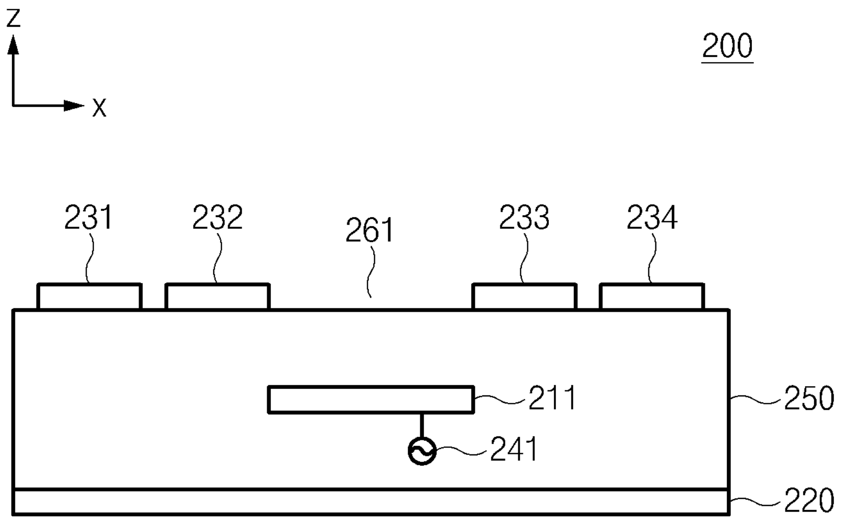
FIG. 3 is a diagram of an antenna device included in an electronic device, according to an embodiment.

FIG. 2 is diagram of an antenna device included in an electronic device, according to an embodiment. FIG. 3 is diagram of an antenna device included in an electronic device, according to an embodiment.

Referring to FIGS. 2 and 3, an antenna device 200 according to an embodiment may include a plurality of antenna radiators 210, a ground member 220, a plurality of conductive cells 230, a plurality of feeding lines 240, and a substrate 250.

The substrate 250 may be formed in a plate shape. The substrate 250 may be made of a material having a relative permittivity of about 3.5, and may be formed of a plurality of layers. The substrate 250 may support the plurality of antenna radiators 210, the ground member 220, the plurality of conductive cells 230, the plurality of feeding lines 240, and the like. The substrate 250 may be a printed circuit board (PCB).

The plurality of antenna radiators (or first conductive pattern) 210 may be arranged in an array. The plurality of antenna radiators 210 may form a 4×4 array. The plurality of antenna radiators 210 may include a first antenna radiator 211, a second antenna radiator 212, a third antenna radiator 213, a fourth antenna radiator 214, and the like. The plurality of antenna radiators 210 may be disposed on the same plane. The plurality of antenna radiators 210 may be disposed on one layer of the plurality of layers included in the substrate 250. The plurality of antenna radiators 210 may be disposed to be exposed outside the substrate 250 or may be embedded in the substrate 250. Each of the plurality of antenna radiators 210 may be in the form of a patch, e.g., a circular patch; however, the disclosure is not so limited. For example, each of the plurality of antenna radiators 210 may have a square patch or various other shapes.

The ground member 220 (or ground plane) may be formed in a plate shape. The ground member 220 may include a plurality of structures. The ground member 220 may be disposed under the plurality of antenna radiators 210. The ground member 220 may be disposed on a layer lower than the layer of the substrate 250 on which the plurality of antenna radiators 210 are disposed. The ground member 220 may be disposed on the bottom surface of the substrate 250, and the ground member 220 may be disposed parallel in relation to the plurality of antenna radiators 210.

The plurality of conductive cells 230 (or conductive island) may be disposed on a plane oriented parallel to the plurality of antenna radiators 210. The plurality of conductive cells 230 may be disposed above the plurality of antenna radiators 210. The plurality of conductive cells 230 may be disposed on or within a gap between the plurality of antenna radiators 210. The plurality of conductive cells 230 may be disposed on a layer upper than the layer of the substrate 250 on which the plurality of antenna radiators 210 are disposed. The plurality of conductive cells 230 may be disposed on the upper surface of the substrate 250. The plurality of conductive cells 230 may be printed on the upper surface of the substrate 250 or may be formed by etching a conductive layer positioned on the upper surface of the substrate 250.

The plurality of conductive cells 230 may be arranged at specified intervals. The plurality of conductive cells 230 may be arranged to form a period structure (or a repeating pattern). The period structure may be an artificial magnetic conductor (AMC) structure or an electromagnetic bandgap (EBG) structure. The surface of the period structure may have high impedance. When the electromagnetic wave is reflected from the period structure, a phase difference between the incident wave and the reflected wave may be zero. The reflection in the horizontal direction may be suppressed and the reflection in the vertical direction may be enhanced, thereby improving the gain of the antenna device 200. Each of the plurality of conductive cells 230 may have a square shape; however, the disclosure is not so limited. For example, each of the plurality of conductive cells 230 may have various shapes. The size of each of the plurality of conductive cells 230 may be, for example, about 1.7 mm×1.7 mm, and the gap between the plurality of conductive cells 230 may be about 56 μm. The impedance of the surface of the period structure at about 28 GHz may be about 17000Ω.

A plurality of openings 260 respectively corresponding to the plurality of antenna radiators 210 may be formed in the periodic structure. The plurality of openings 260 may be a partial region of the period structure in which a conductive cell is not disposed. At least part of the plurality of antenna radiators 210 may be exposed through the plurality of openings 260, respectively. The sizes of the plurality of antenna radiators 210 may be smaller than the sizes of the plurality of openings 260, respectively.

Two or more conductive cells may be arranged between the plurality of openings 260 in a direction in which the plurality of openings 260 are spaced apart from each other. A first conductive cell 231 and a second conductive cell 232 may be disposed between the first opening 261 corresponding to the first antenna radiator 211 and a second opening 262 corresponding to the second antenna radiator 212, in the X-axis direction, and a third conductive cell 233 and a fourth conductive cell 234 may be disposed between the first opening 261 corresponding to the first antenna radiator 211 and a third opening 263 corresponding to the third antenna radiator 213, in the X-axis direction. The performance of the antenna device 200 having the aforementioned period structure may be maintained by arranging two or more conductive cells adjacent to each other.

The plurality of feeding lines 240 may be electrically connected to the plurality of antenna radiators 210, respectively. For example, a first feeding line 241, a second feeding line 242, a third feeding line 243, and a fourth feeding line 244 may be electrically connected to the first antenna radiator 211, the second antenna radiator 212, the third antenna radiator 213, and the fourth antenna radiator 214, respectively. The plurality of feeding lines 240 may be electrically connected to a communication circuit (e.g., the communication module 190 of FIG. 1) and may respectively feed power to the plurality of antenna radiators 210.

The plurality of antenna radiators 210 may be configured to transmit or receive a signal in a band including about 26 GHz to about 31 GHz. The resonance frequency of the plurality of antenna radiators 210 may be changed depending on at least part of the size of each of the plurality of antenna radiators 210, the distance between the ground member 220 and the plurality of antenna radiators 210, and the distance between the plurality of antenna radiators 210 and the plurality of conductive cells 230.

Figure 4:
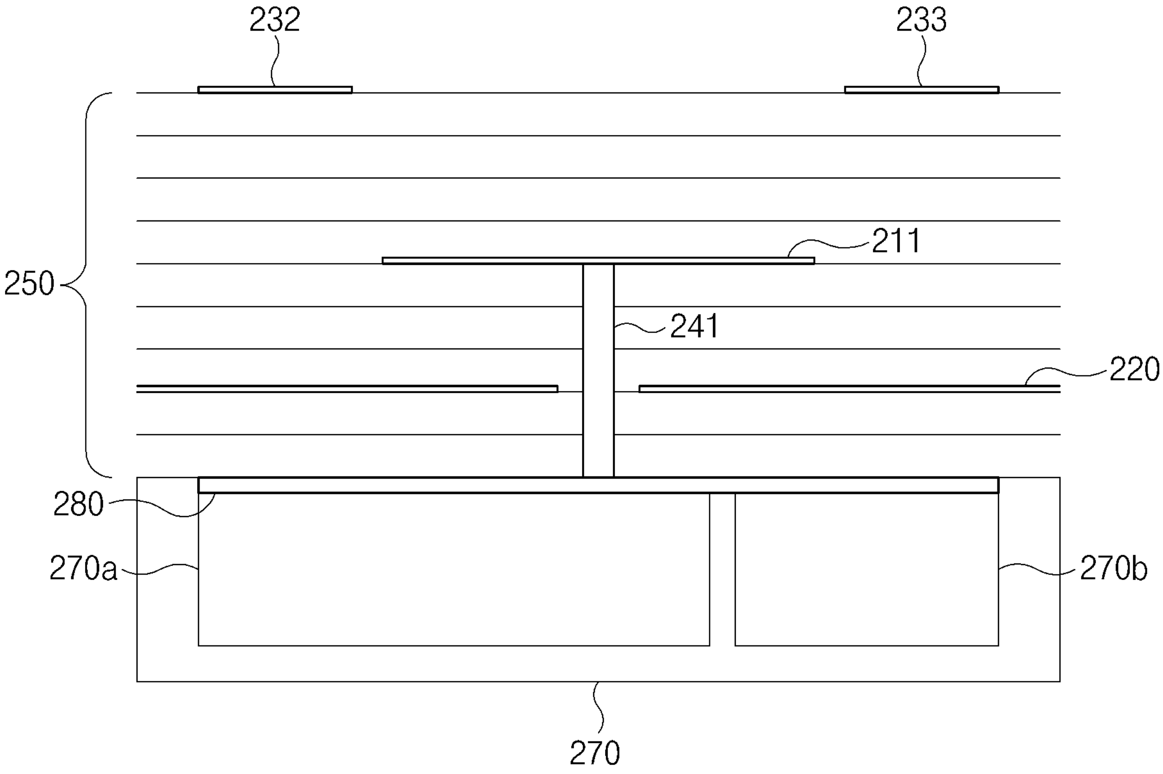
FIG. 4 is a diagram of an antenna device included in an electronic device, according to an embodiment.

FIG. 4 is diagram of an antenna device included in an electronic device, according to an embodiment.

Referring to FIG. 4, the substrate 250 of an antenna device (e.g., the antenna device 200 of FIG. 2) may include a plurality of layers. The conductive cells 232 and 233 may be disposed on the first layer of the substrate 250, that is, the upper surface of the substrate 250. The antenna radiator 211 may be disposed on the fifth layer of the substrate 250 that is lower than the first layer of the substrate 250. The ground member 220 may be disposed on the eighth layer of the substrate 250 that is lower than the fifth layer of the substrate 250. A feeding network layer 280 may be disposed on the bottom surface of the substrate 250. The feeding line 241 may electrically connect the feeding network layer 280 to the antenna radiator 211. The feeding network layer 280 may be electrically connected to a communication circuit 270 or the like. The communication circuit 270 may include an RF IC 270*a* and a communication module 270*b*, and the communication circuit 270 may be disposed adjacent to the feeding network layer 280 and may be integrally formed with the feeding network layer 280.

The resonance frequency of the antenna radiator 211 may be changed depending on the distance between the antenna radiator 211 and the ground member 220 and the distance between the antenna radiator 211 and the conductive cell 232 or 233. The resonant frequency of the antenna radiator 211 may be adjusted by changing the layer of the substrate 250 on which the antenna radiator 211 is disposed.

Figure 5:
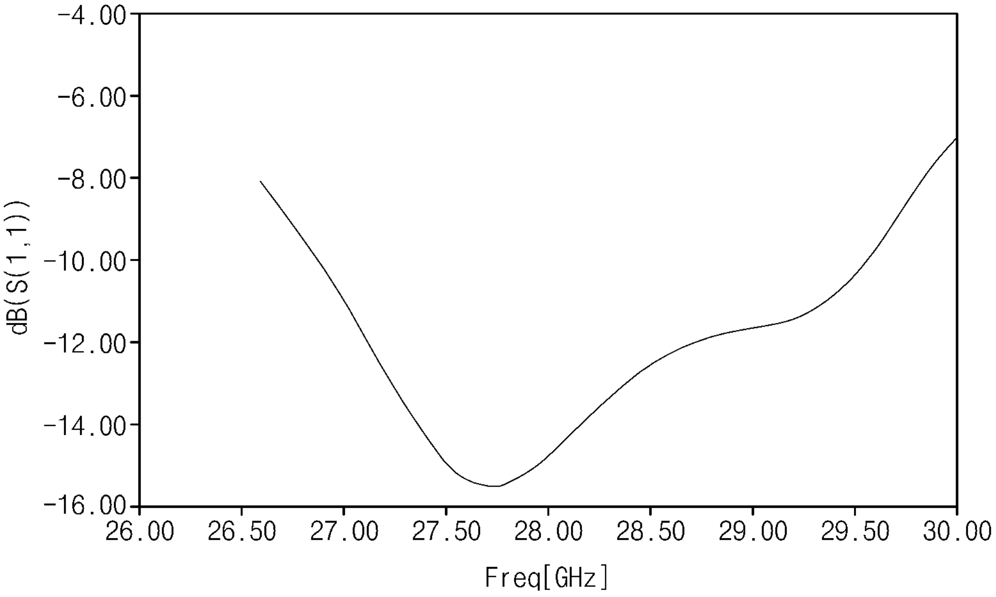
FIG. 5 is a graph of a reflection coefficient according to a frequency of an antenna device included in an electronic device, according to an embodiment.

FIG. 5 is a graph of a reflection coefficient according to a frequency of an antenna device included in an electronic device, according to an embodiment.

Referring to FIG. 5, the reflection coefficient of an antenna device (e.g., the antenna device 200 of FIG. 2) may be less than −10 dB in a range between about 26.8 GHz and about 29.6 GHz. At 26.8 GHz, the peak gain of the antenna device 200 may be about 7.2 dB, and at 29.6 GHz, the peak gain of the antenna device 200 may be about 7.3 dB. At 28 GHz, the reflection coefficient of the antenna device 200 may be about −15 dB, and the peak gain of the antenna device 200 may be about 7.7 dB.

Figure 6:
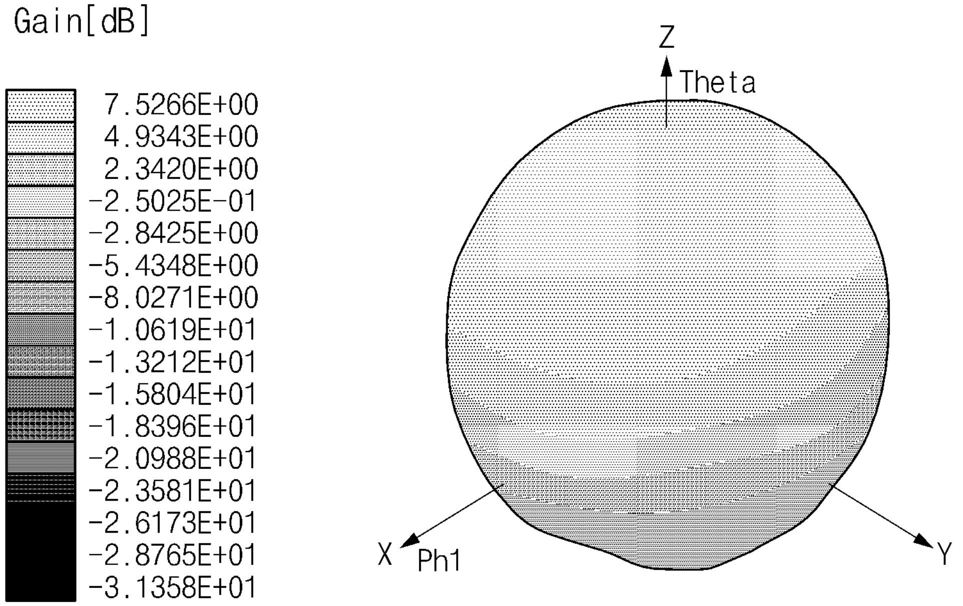
FIG. 6 is a graph of a gain according to a direction of an antenna device included in an electronic device, according to an embodiment.

FIG. 6 is a graph of a gain according to a direction of an antenna device included in an electronic device, according to an embodiment.

Referring to FIG. 6, an antenna device (e.g., the antenna device 200 of FIG. 2) may radiate a signal in the Z-axis direction, that is, the upward direction of the antenna device 200. The gain of the antenna device 200 in the Z-axis direction may be about 7.53 dB.

Figure 7:
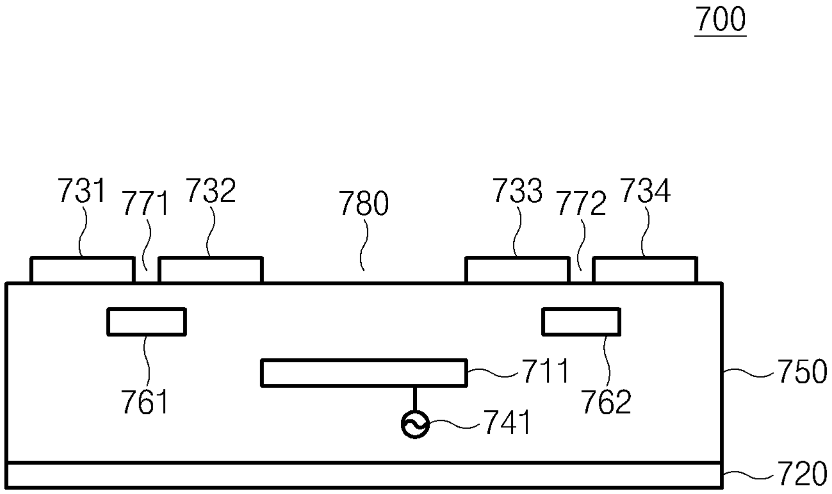
FIG. 7 is a diagram of an antenna device included in an electronic device, according to an embodiment.

FIG. 7 is a diagram of an antenna device included in an electronic device, according to an embodiment.

Referring to FIG. 7, an antenna device 700 may include an antenna radiator 711, a ground member 720, a first conductive cell 731, a second conductive cell 732, a third conductive cell 733, a fourth conductive cell 734, a feeding line 741, a substrate 750, a first coupling pad 761, and a second coupling pad 762. The antenna radiator 711, the ground member 720, the first conductive cell 731, the second conductive cell 732, the third conductive cell 733, the fourth conductive cell 734, the feeding line 741, an opening 780, and the substrate 750 of FIG. 7 may be implemented in a manner similar to the first antenna radiator 211, the ground member 220, the first conductive cell 231, the second conductive cell 232, the third conductive cell 233, the fourth conductive cell 234, the first feeding line 241, the first opening 261, and the substrate 250 of FIG. 2. For convenience of description, a description about the antenna radiator 711, the ground member 720, the first conductive cell 731, the second conductive cell 732, the third conductive cell 733, the fourth conductive cell 734, the feeding line 741, and the substrate 750 will not be repeated herein.

The coupling pad 761 or 762 may be disposed under the gap 771 or 772 between the plurality of conductive cells 731 and 732 or 733 and 734. For example, the first coupling pad 761 may be disposed under the first gap 771 between the first conductive cell 731 and the second conductive cell 732, and the second coupling pad 762 may be disposed under the second gap 772 between the third conductive cell 733 and the fourth conductive cell 734. The coupling pads 761 and 762 may be electrically coupled to the conductive cells adjacent to the gaps 771 and 772 on the coupling pads 761 and 762, respectively. The first coupling pad 761 may be electrically coupled to the first conductive cell 731 and the second conductive cell 732, and the second coupling pad 762 may be electrically coupled to the third conductive cell 733 and the fourth conductive cell 734.

When the coupling pads 761 and 762 are used as described above, the size of each of the plurality of conductive cells 731, 732, 733, and 734 may be reduced. The electrical length of each of the plurality of conductive cells 731, 732, 733, and 734 may be increased due to the coupling between the coupling pad 761 or 762 and a plurality of conductive cells 731 and 732 or 733 and 734. Even through the size of each of the plurality of conductive cells 731, 732, 733, and 734 is reduced, the electrical length of the plurality of conductive cells 731, 732, 733, and 734 may be maintained, and the resonance frequency of a period structure may be maintained, by employing the coupling pad 761 or 762. When the coupling pads 761 and 762 is used as described above, the size of each of the plurality of conductive cells 731, 732, 733 and 734 may be about 1.325 mm×1.325 mm, and the gap 771 or 772 between the plurality of conductive cells 731 and 732 or 733 and 734 may be about 50 μm. The impedance of the surface of the period structure at about 28 GHz may be about 16000Ω.

Figure 8:
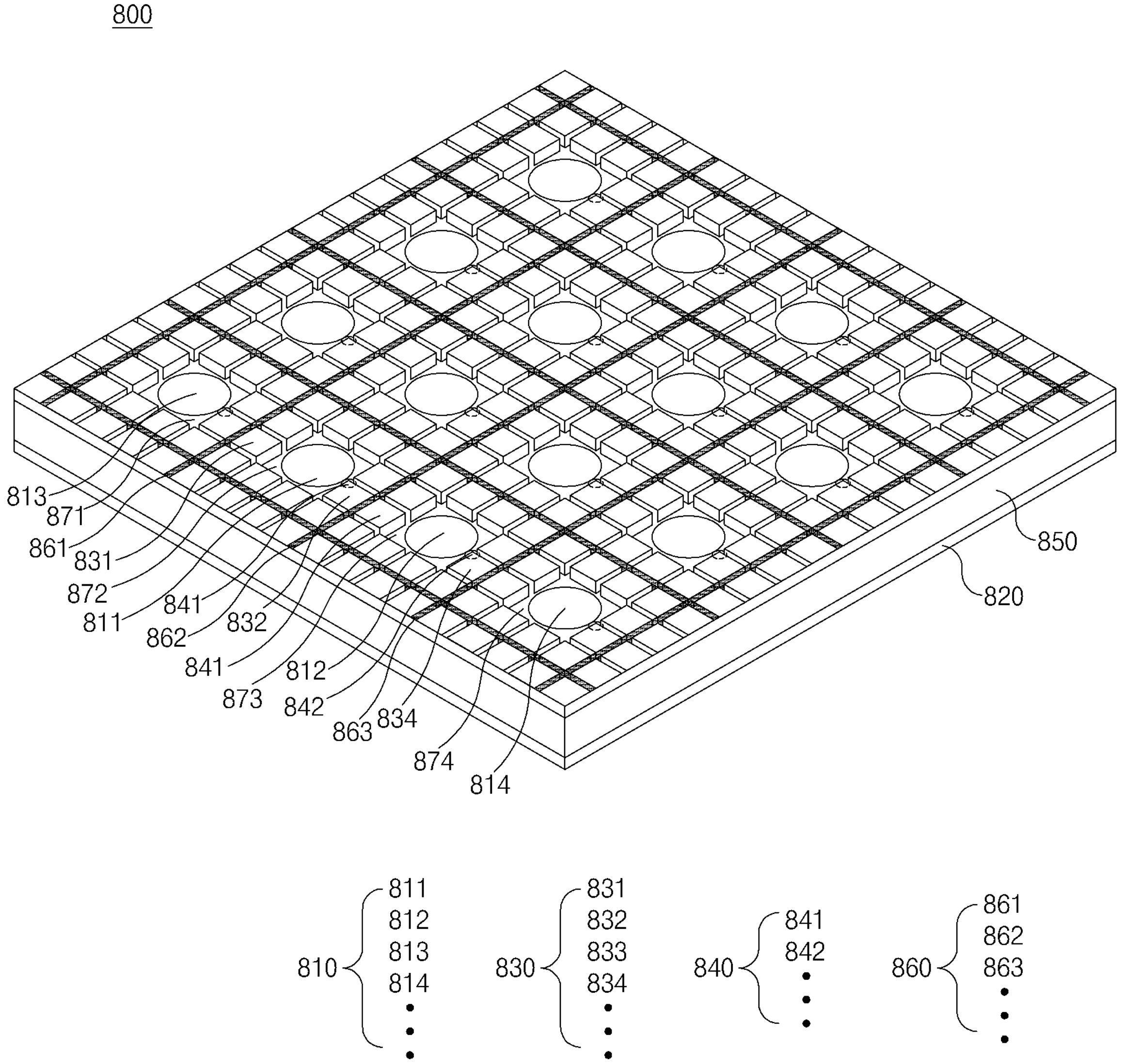
FIG. 8 is a diagram of an antenna device included in an electronic device, according to an embodiment.
Figure 9:
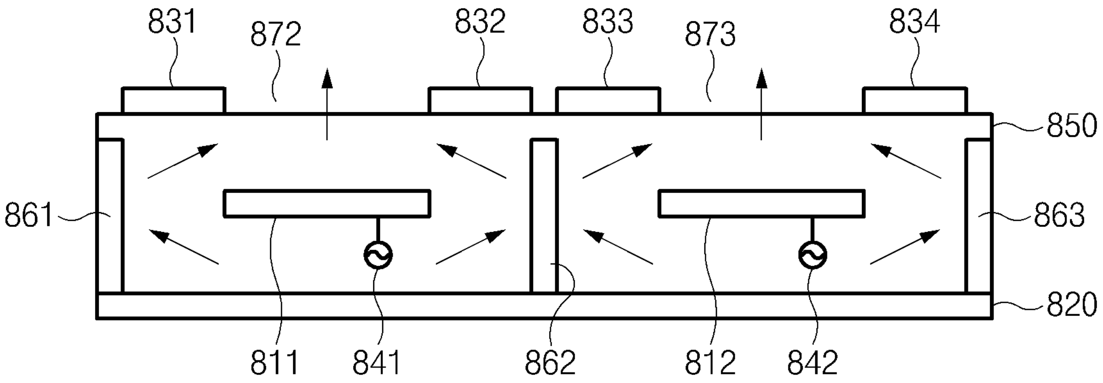
FIG. 9 is a diagram of an antenna device included in an electronic device, according to an embodiment.

FIG. 8 is a diagram of an antenna device included in an electronic device, according to an embodiment. FIG. 9 is a diagram of an antenna device included in an electronic device, according to an embodiment.

Referring to FIGS. 8 and 9, an antenna device 800 may include a plurality of antenna radiators 810, a ground member 820, a plurality of conductive cells 830, a plurality of feeding lines 840 (including feeding lines 841/842), a substrate 850, and a plurality of partitions 860. The plurality of antenna radiators 810, the ground member 820, the plurality of conductive cells 830, the plurality of feeding lines 840, and the substrate 850 illustrated in FIGS. 8 and 9 may be implemented in a manner similar to the plurality of antenna radiators 210, the ground member 220, the plurality of conductive cells 230, the plurality of feeding lines 240, and the substrate 250 illustrated in FIGS. 2 and 3. For convenience of description, a description about the plurality of antenna radiators 810, the ground member 820, the plurality of conductive cells 830, the plurality of feeding lines 840, and the substrate 850 will not be repeated herein.

The plurality of partitions 860 may be formed in gaps between the plurality of antenna radiators 810. For example, the plurality of partitions 860 may be formed in a lattice shape surrounding each of the plurality of antenna radiators 810. The first partition 861 may be formed between the first antenna radiator 811 and the third antenna radiator 813, the second partition 862 may be formed between the first antenna radiator 811 and the second antenna radiator 812, and the third partition 863 may be formed between the second antenna radiator 812 and the fourth antenna radiator 814. The plurality of partitions 860 may surround each of the plurality of antenna radiators 810. For example, the plurality of partitions 860 may surround the plurality of antenna radiators 810 laterally, and the height of each of the plurality of partition 860 may be greater than the distance between the plurality of antenna radiators 810 and the ground member 820. The plurality of partitions 860 surrounding the plurality of antenna radiators 810 may be formed by arranging the period structure to be higher or greater than the plurality of antenna radiators 810.

A part of the signal radiated by the first antenna radiator 811 may be reflected by the first partition 861 and the second partition 862. As a result, the influence of the signal radiated by the first antenna radiator 811 on the second antenna radiator 812 may be reduced. A part of the reflected signal may be radiated to the outside through the second opening 872 between the first conductive cell 831 and the second conductive cell 832. Accordingly, the gain in the Z-axis direction of the antenna device 800 may be improved. Similarly, a part of the signal radiated by the second antenna radiator 812 may be reflected by the second partition 862 and the third partition 863. A part of the reflected signal may be radiated to the outside through the third opening 873 (or a fourth opening 874) between the third conductive cell 833 and the fourth conductive cell 834.

As described above, the isolation between antenna radiators (e.g., the first antenna radiator 811 and the second antenna radiator 812) adjacent to each other may be improved and the gain of the antenna device may be improved, by forming the plurality of partitions 860 surrounding the plurality of antenna radiators 810.

In FIGS. 8 and 9, as the plurality of partitions 860 are in the shape of a lattice; however, the disclosure is not so limited. For example, the plurality of partitions 860 may be formed in various shapes surrounding each of the plurality of antenna radiators 810. For example, the antenna device 800 may include a partition of a square array shape that surrounds each of the plurality of antenna radiators 810.

Figure 10:
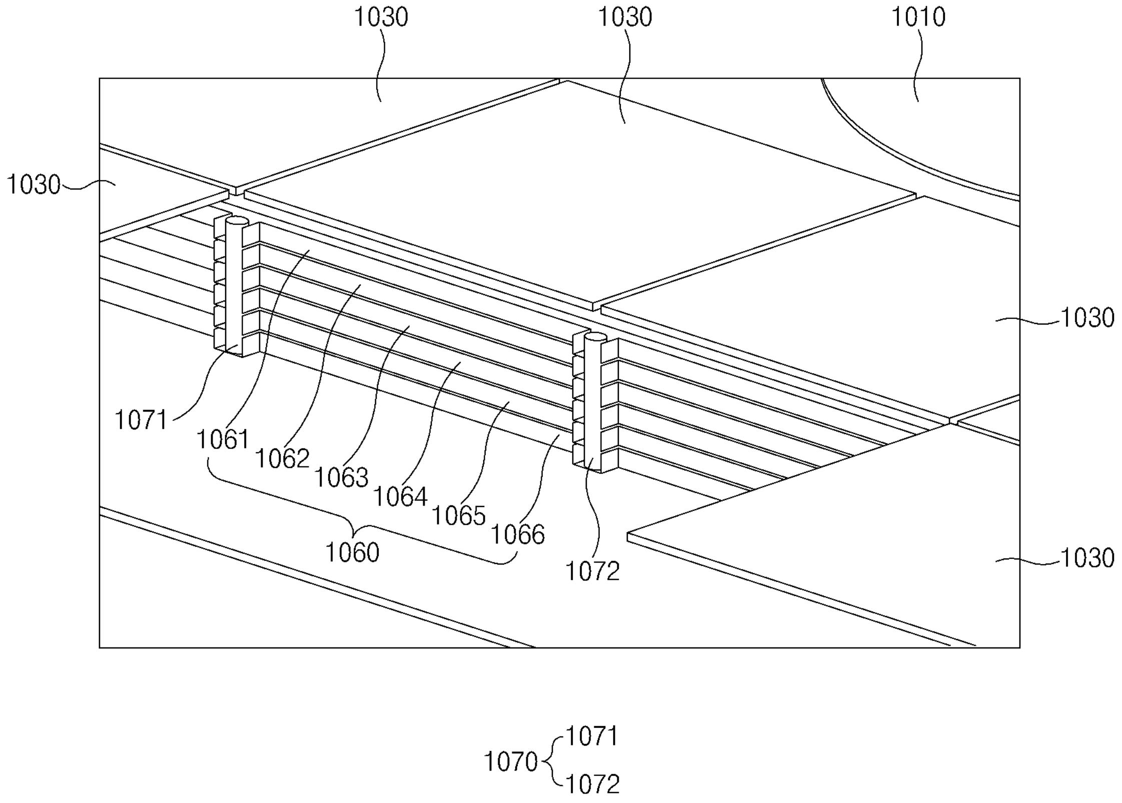
FIG. 10 is a diagram of a part of an antenna device included in an electronic device, according to an embodiment.

FIG. 10 is diagram of a part of an antenna device included in an electronic device, according to an embodiment.

Referring to FIG. 10, the antenna device may include an antenna radiator 1010, a conductive cell 1030, and a partition 1060.

The partition 1060 may include a plurality of lines 1061, 1062, 1063, 1064, 1065, and 1066 that are arranged between a plurality of layers of a substrate. The plurality of lines 1061, 1062, 1063, 1064, 1065, and 1066 may be stacked in a thickness direction of the substrate, thereby forming the partition 1060. The partition 1060 may include a plurality of vias 1070 (including vias 1071, 1072) arranged along the direction in which the partition 1060 extends. The plurality of lines 1061, 1062, 1063, 1064, 1065, and 1066 may be connected to a ground member (e.g., the ground member 820 in FIGS. 8 and 9) through the plurality of vias 1070, and thus, the partition 1060 may be formed.

Figure 11:
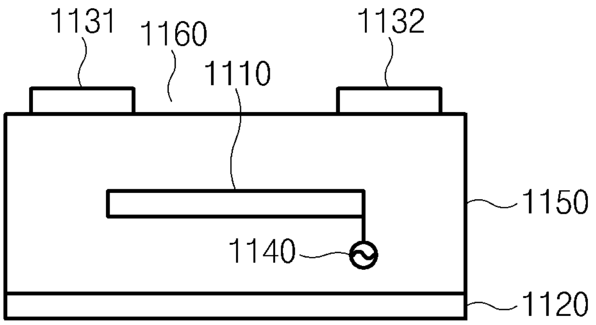
FIG. 11 is a diagram of an antenna device included in an electronic device, according to an embodiment.

FIG. 11 is diagram of an antenna device included in an electronic device, according to an embodiment.

Referring to FIG. 11, the antenna device may include an antenna radiator 1110, a ground member 1120, a first conductive cell 1131, a second conductive cell 1132, a feeding line 1140, and a substrate 1150. The antenna radiator 1110, the ground member 1120, the first conductive cell 1131, the second conductive cell 1132, the feeding line 1140, the opening 1160, and the substrate 1150 of FIG. 11 may be implemented in a manner similar to the first antenna radiator 211, the ground member 220, the second conductive cell 232, the third conductive cell 233, the first feeding line 241, the first opening 261, and the substrate 250 of FIGS. 2 and 3, respectively. For convenience of description, a description about the antenna radiator 1110, the ground member 1120, the first conductive cell 1131, the second conductive cell 1132, the feeding line 1140, and the substrate 1150 will not be repeated herein.

The feeding line 1140 may be electrically connected to the end of the antenna radiator 1110. A point at which the feeding line 1140 is connected may be determined based on the current and the voltage on the antenna radiator 1110. For example, a magnitude of the current at the center of the antenna radiator 1110 may be greater than the magnitude of a current at the periphery of the antenna radiator 1110. A magnitude of the voltage at the center of the antenna radiator 1110 may be smaller than a magnitude of the voltage at the periphery of the antenna radiator 1110. Accordingly, a magnitude of a resistance at the center of the antenna radiator 1110 may be smaller or less than the magnitude of the resistance at the periphery of the antenna radiator 1110. When each of the first conductive cell 1131 and the second conductive cell 1132 are a part of the period structure, the feeding line 1140 needs to be connected to a point where the resistance of the antenna radiator 1110 is high due to the high resistance of the period structure. Accordingly, the feeding line 1140 may be electrically connected to the end of the antenna radiator 1110 that is the point where the resistance is relatively high.

Figure 12A:
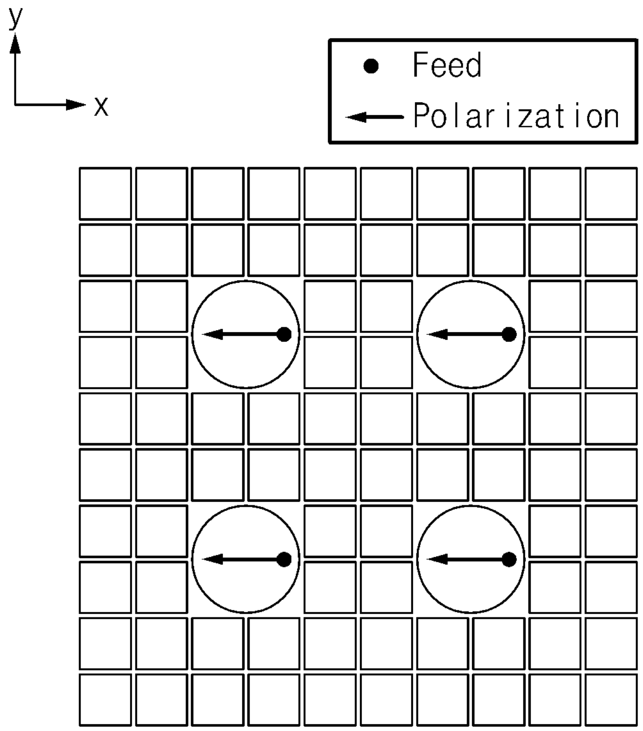
FIGS. 12A and 12B are a diagrams of an antenna device included in an electronic device, according to an embodiment.
Figure 12B:
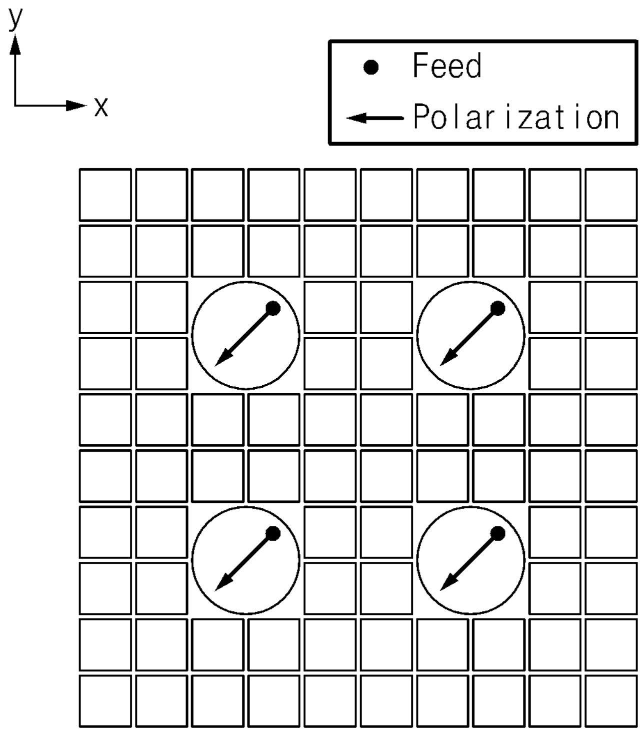

FIGS. 12A and 12B are diagrams of an antenna device included in an electronic device, according to an embodiment.

Referring to FIG. 12A, a feeding point associated with the antenna radiator (e.g., the plurality of antenna radiators 210 of FIGS. 2 and 3, the antenna radiator 711 of FIG. 7, the plurality of antenna radiators 810 of FIGS. 8 and 9, the antenna radiator 1110 of FIG. 11, or the like) may be positioned on the right-side end of the antenna radiator (in a direction of 0 degree from the center of the antenna radiator). When the feeding point is positioned on the right-side end, horizontal polarization may be generated by the antenna radiator.

Referring to FIG. 12B, the feeding point associated with an antenna radiator may be positioned on the upper right end of the antenna radiator (in a direction of 45 degrees from the center of the antenna radiator). When the feeding point is positioned on the upper right end, the polarization of 45 degrees may be generated by the antenna radiator.

The distance between polarizations generated by the plurality of antenna radiators when the polarization of 45 degrees is generated may be longer or greater than the distance between polarizations generated by the plurality of antenna radiators when the horizontal polarization is generated. Accordingly, the isolation between a plurality of antenna radiators may be improved.

Figure 13A:
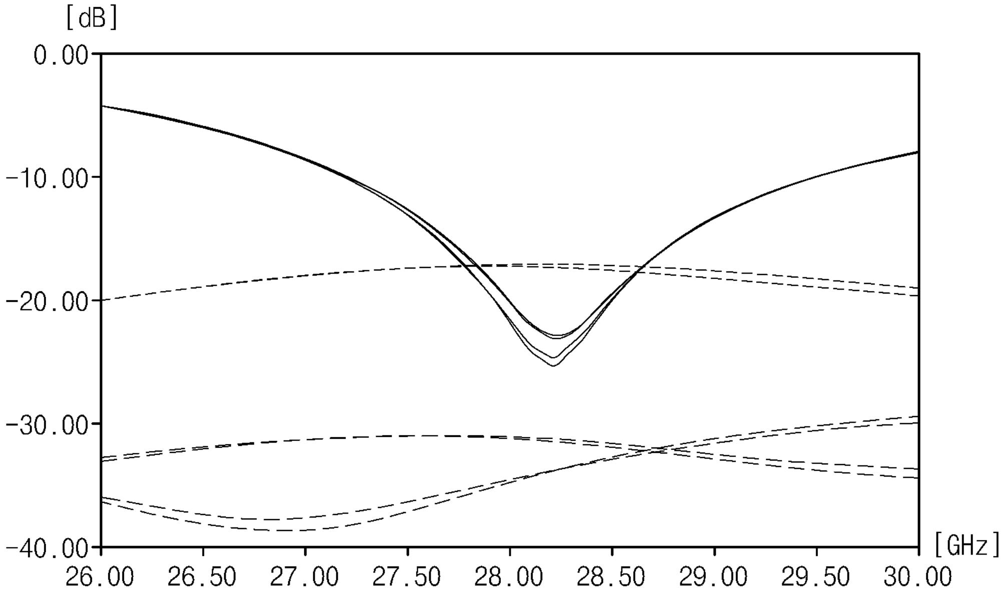
FIGS. 13A and 13B are graphs of a reflection coefficient and isolation according to a frequency of an antenna device included in an electronic device, according to an embodiment.
Figure 13B:
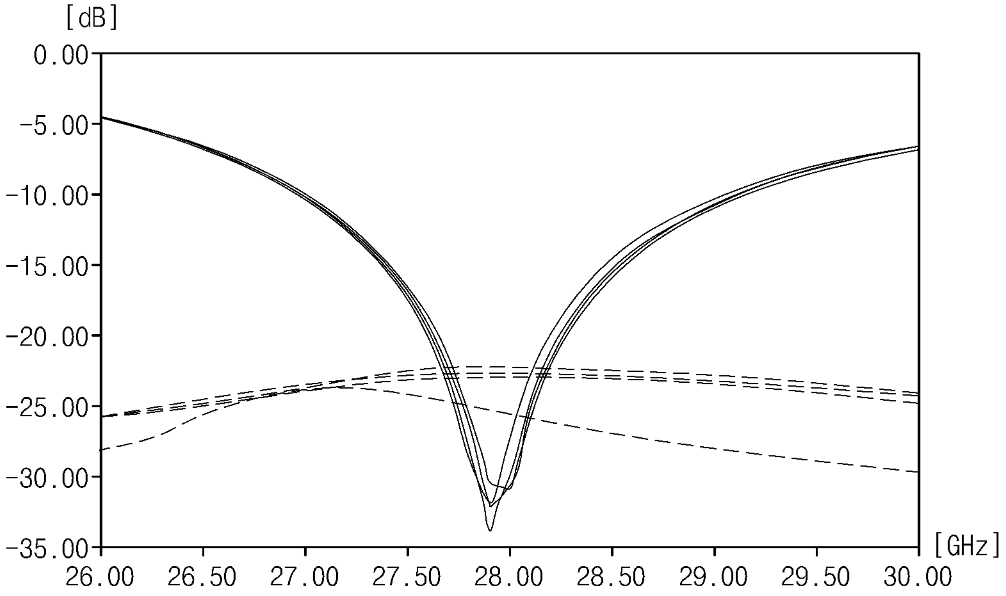

FIGS. 13A and 13B are graphs of a reflection coefficient and isolation according to a frequency of an antenna device included in an electronic device, according to an embodiment.

FIG. 13A illustrates the reflection coefficient according to the frequency of a plurality of antenna radiators and the isolation (transmission coefficient) between the plurality of antenna radiators shown in FIG. 12A. In FIG. 13A, the reflection coefficient is shown by a solid line, and the isolation is shown by a dash line. Referring to FIG. 13A, when a feeding point is positioned on the right-side end (the direction of 0 degree) of an antenna radiator, the highest reflection coefficient at 28 GHz may be about −20 dB, and the highest isolation at 28 GHz may be about −17 dB.

FIG. 13B illustrates the reflection coefficient according to the frequency of a plurality of antenna radiators and the isolation between the plurality of antenna radiators shown in FIG. 12B. In FIG. 13B, the reflection coefficient is shown by a solid line, and the isolation is shown by a dash line. Referring to FIG. 13B, when a feeding point is positioned on the upper right end (the direction of 45 degree) of an antenna radiator, the highest reflection coefficient at 28 GHz may be about −26 dB, and the highest isolation at 28 GHz may be about −22 dB.

The reflection coefficient of the plurality of antenna radiators may be reduced, and the isolation between the plurality of antenna radiators may be increased, by changing the locations of the feeding points of the plurality of antenna radiators.

FIGS. 14A to 14D are diagrams of an antenna device included in an electronic device, according to an embodiment.

Referring to FIGS. 14A to 14D, an antenna device 1400*a* may include a first antenna radiator 1411*a*, a second antenna radiator 1412*a*, a third antenna radiator 1413*a*, a fourth antenna radiator 1414*a*, a first conductive cell 1431*a*, a second conductive cell 1432*a*, a third conductive cell 1433*a*, a fourth conductive cell 1434*a*, a ground member 1420*a*, and a connection member 1470*a*.

The first conductive cell 1431*a*, the second conductive cell 1432*a*, the third conductive cell 1433*a*, and the fourth conductive cell 1434*a* may be respectively disposed in gaps between the first antenna radiator 1411*a*, the second antenna radiator 1412*a*, the third antenna radiator 1413*a*, and the fourth antenna radiator 1414*a*. The connection member 1470*a* may be interposed between the first conductive cell 1431*a*, the second conductive cell 1432*a*, the third conductive cell 1433*a*, and the fourth conductive cell 1434*a*, or the connection member 1470*a* may be connected to the first conductive cell 1431*a*, the second conductive cell 1432*a*, the third conductive cell 1433*a*, and the fourth conductive cell 1434*a*, or the connection member 1470*a* may be integrally formed with the first conductive cell 1431*a*, the second conductive cell 1432*a*, the third conductive cell 1433*a*, and the fourth conductive cell 1434*a*. When the connection member 1470*a* is attached to the first conductive cell 1431*a*, the second conductive cell 1432*a*, the third conductive cell 1433*a*, and the fourth conductive cell 1434*a*, the gain of the antenna device 1400*a* may be improved. For example, the connection member 1470*a* may prevent the coupling between the first antenna radiator 1411*a* and the fourth antenna radiator 1414*a* and the coupling between the second antenna radiator 1412*a* and the third antenna radiator 1413*a*, thereby improving the performance of antenna radiators 1411*a*, 1411*b*, 1411*c*, and 1411*d*.

Figure 14A:
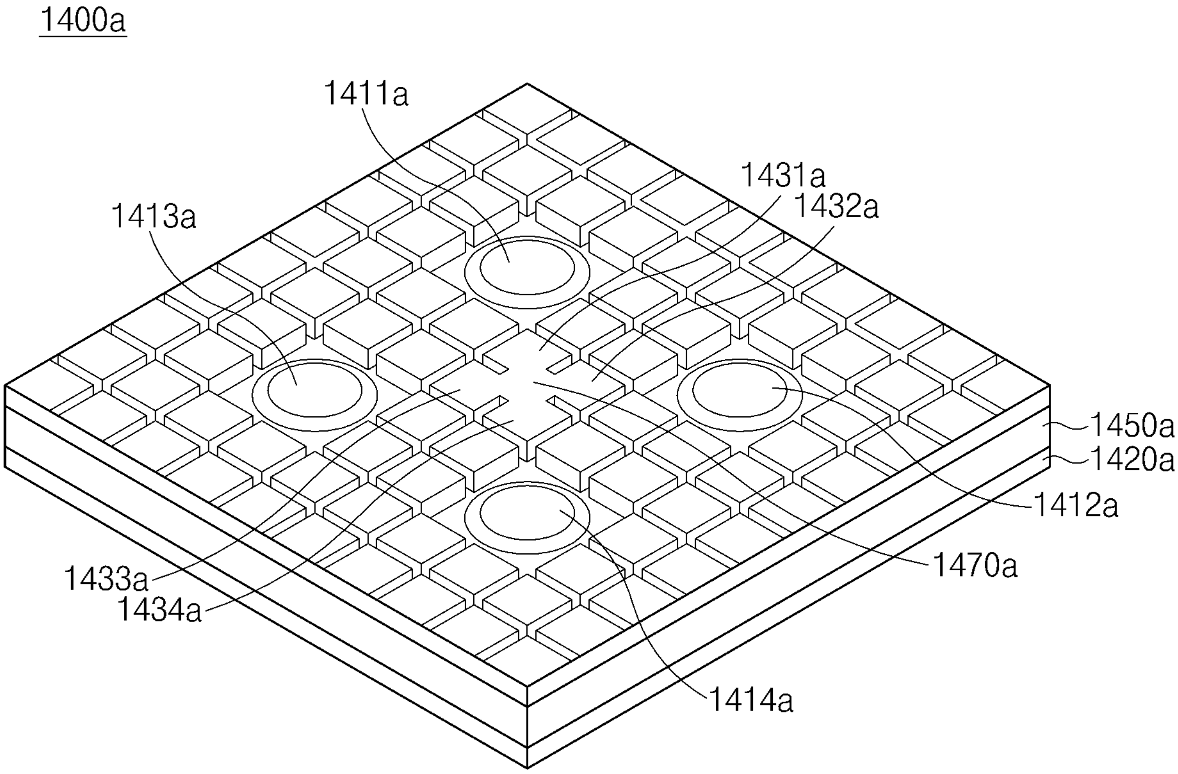
FIGS. 14A to 14D diagrams of an antenna device included in an electronic device, according to an embodiment.
Figure 14B:
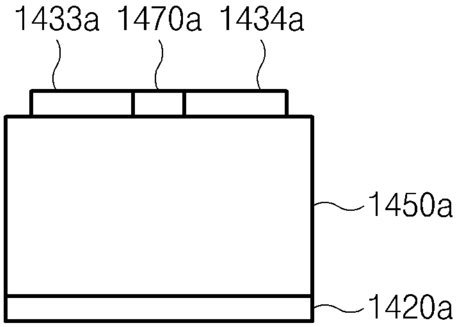
Figure 14C:
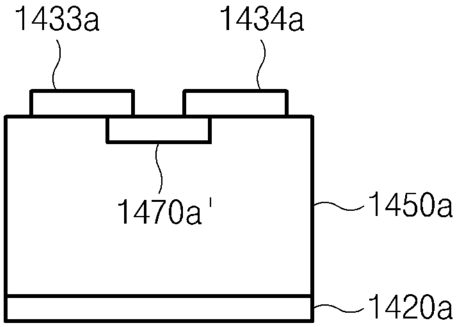

Referring to FIG. 14C, the connection member 1470*a*' may be disposed under the first conductive cell 1431*a*, the second conductive cell 1432*a*, the third conductive cell 1433*a*, and the fourth conductive cell 1434*a*. The connection member 1470*a*' may be positioned inside a substrate 1450*a*. The connection member 1470*a* may be connected to the first conductive cell 1431*a*, the second conductive cell 1432*a*, the third conductive cell 1433*a*, and the fourth conductive cell 1434*a*. Alternatively or additionally, the connection member 1470*a*' may be disposed on the first conductive cell 1431*a*, the second conductive cell 1432*a*, the third conductive cell 1433*a*, and the fourth conductive cell 1434*a*.

Figure 14D:
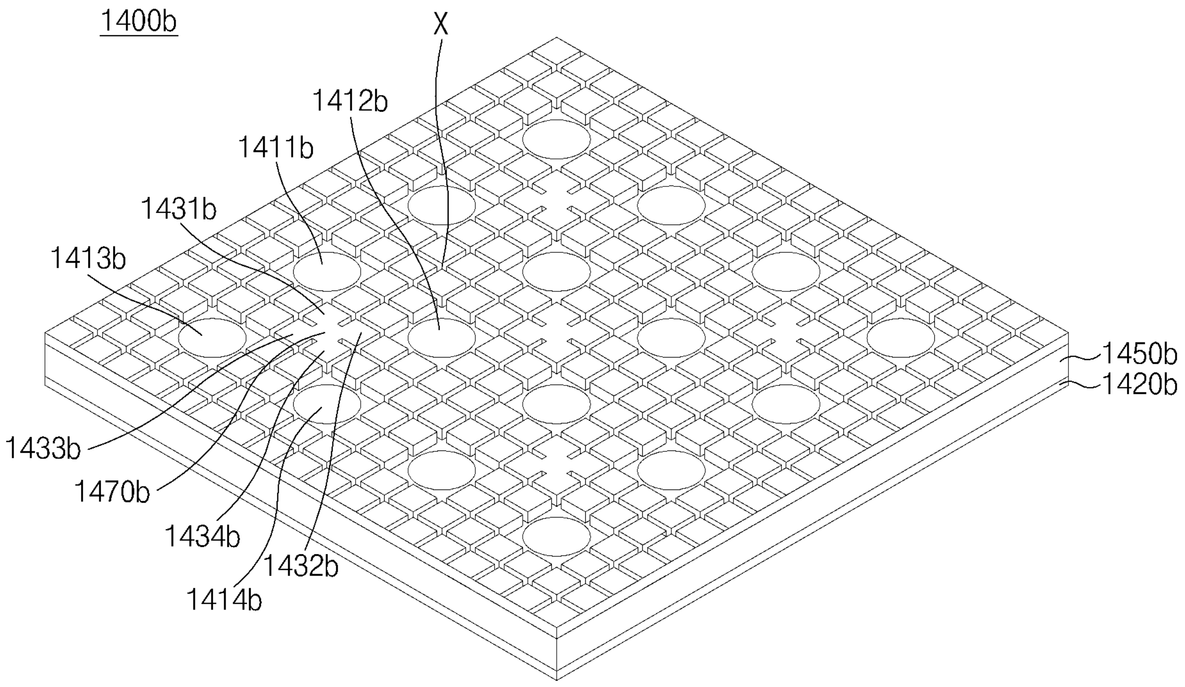

Referring to FIG. 14D, an antenna device 1400*b* may include a first antenna radiator 1411*b*, a second antenna radiator 1412*b*, a third antenna radiator 1413*b*, a fourth antenna radiator 1414*b*, a first conductive cell 1431*b*, a second conductive cell 1432*b*, a third conductive cell 1433*b*, a fourth conductive cell 1434*b*, a ground member 1420*b*, a substrate 1450*b*, and a connection member 1470*b*.

The first conductive cell 1431*b*, the second conductive cell 1432*b*, the third conductive cell 1433*b*, and the fourth conductive cell 1434*b* may be respectively disposed in gaps between the first antenna radiator 1411*b*, the second antenna radiator 1412*b*, the third antenna radiator 1413*b*, and the fourth antenna radiator 1414*b*. The connection member 1470*b* may be interposed between the first conductive cell 1431*b*, the second conductive cell 1432*b*, the third conductive cell 1433*b*, and the fourth conductive cell 1434*b* or may be disposed under the first conductive cell 1431*b*, the second conductive cell 1432*b*, the third conductive cell 1433*b*, and the fourth conductive cell 1434*b*, or the connection member 1470*b* may be connected to the first conductive cell 1431*b*, the second conductive cell 1432*b*, the third conductive cell 1433*b*, and the fourth conductive cell 1434*b*. The gain of the antenna device 1400*b* may be improved by employing the above-described connection member 1470*b*. When other connection members are disposed at a point X adjacent to the point where the connection member 1470*b* is disposed, since the performance of the antenna device 1400*b* is deteriorated due to excessive distortion, other connection members may not be disposed at a point adjacent to the point where the connection member 1470*b* is disposed.

Figure 15A:
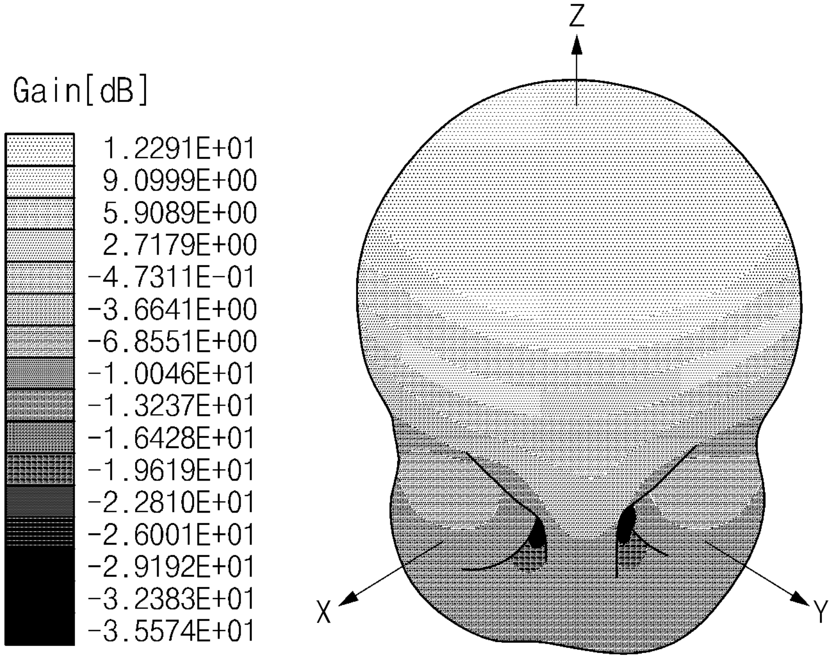
FIGS. 15A and 15B are graphs of a gain according to a direction of an antenna device included in an electronic device, according to an embodiment.
Figure 15B:
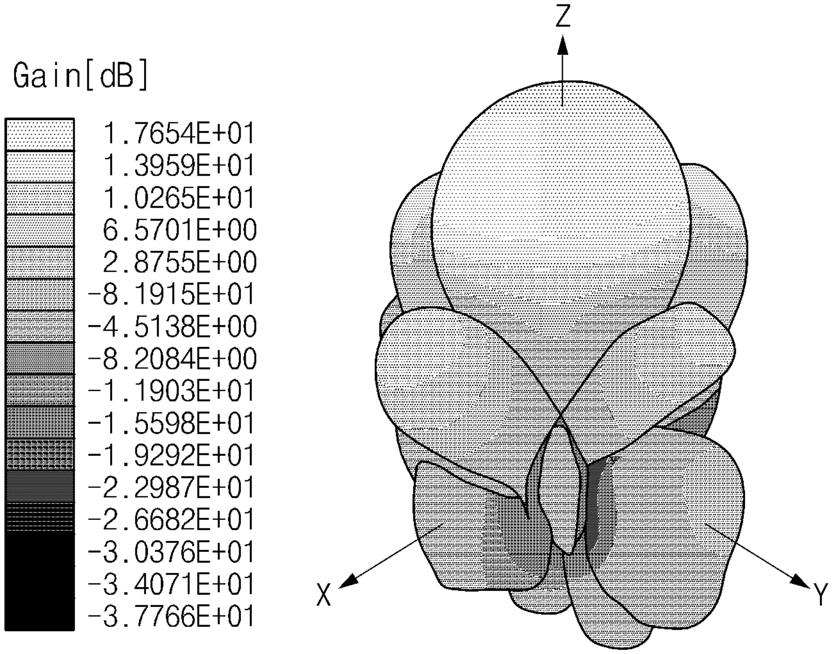

FIGS. 15A and 15B are graphs of a gain according to a direction of an antenna device included in an electronic device, according to an embodiment.

FIG. 15A indicates a gain according to the direction of an antenna device illustrated in FIG. 14A. Referring to FIG. 15A, an antenna device may radiate a signal in the Z-axis direction. When the connection member 1470*a* is not employed, the gain of the antenna device in the Z-axis direction may be about 11.8 dB. When the connection member 1470*a* is employed, the gain of the antenna device in the Z-axis direction may be about 12.3 dB. The gain in the Z axis direction of the antenna device shown in FIG. 15A may be higher or greater than the gain (about 7.52 dB) in the Z axis direction of the antenna device 200 shown in FIG. 6 by about 5 dB. The radiation direction of the antenna device may be concentrated in the Z-axis direction, and the gain in the Z-axis direction of the antenna device may be improved, by employing the connection member 1470*a*.

FIG. 15B indicates a gain according to the direction of an antenna device illustrated in FIG. 14D. Referring to FIG. 15B, an antenna device may radiate a signal in the Z-axis direction. When the connection member 1470*b* is not employed, the gain of the antenna device in the Z-axis direction may be about 17.5 dB. When the connection member 1470*b* is employed, the gain of the antenna device in the Z-axis direction may be about 17.65 dB. The gain in the Z axis direction of the antenna device shown in FIG. 15B may be higher or greater than the gain (about 7.52 dB) in the Z axis direction of the antenna device 200 shown in FIG. 6 by about 10 dB. The radiation direction of the antenna device may be concentrated in the Z-axis direction, and the gain in the Z-axis direction of the antenna device may be improved, by employing the connection member 1470*b*.

Figure 16:
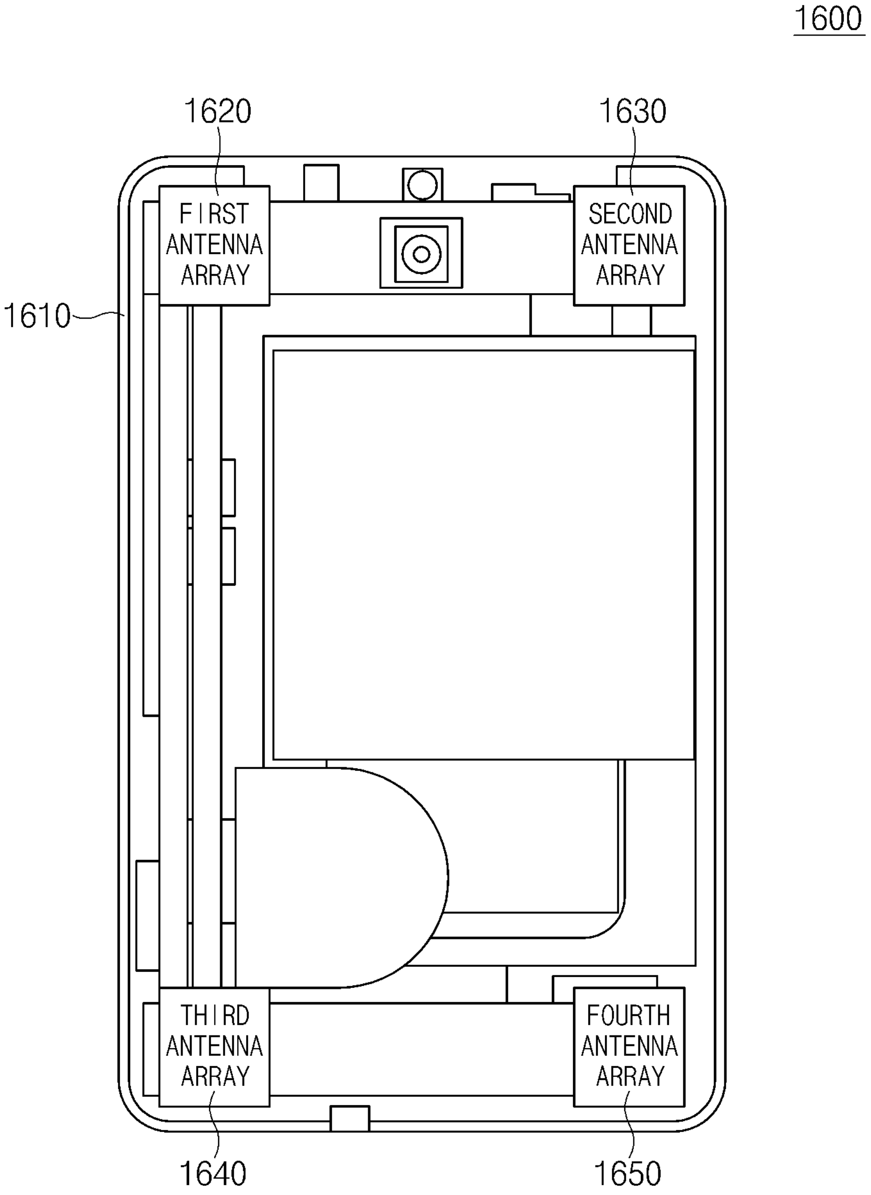
FIG. 16 is a diagram of an internal structure of an electronic device, according to an embodiment.

FIG. 16 is a diagram of an internal structure of an electronic device, according to an embodiment.

Referring to FIG. 16, an electronic device 1600 may include a housing 1610, a first antenna array 1620, a second antenna array 1630, a third antenna array 1640, and a fourth antenna array 1650. The electronic device 1600 may be a mobile terminal, or one of the other previously described electronic devices.

The housing 1610 may house and protect the other elements of the electronic device 1600. The housing 1610 may include a front plate, a back plate facing away from the front plate, and a side member (or metal frame), which is attached to the back plate or is integrally formed with the back plate and which surrounds a space between the front plate and the back plate.

The first antenna array 1620, the second antenna array 1630, the third antenna array 1640, and the fourth antenna array 1650 may be positioned inside the housing 1610. Each of the first antenna array 1620, the second antenna array 1630, the third antenna array 1640, and the fourth antenna array 1650 may include the antenna device 200 illustrated in FIG. 2, the antenna device 800 illustrated in FIG. 8, or any of the other antenna devices described herein. The first antenna array 1620 may be disposed on the upper left of the electronic device 1600; the second antenna array 1630 may be disposed on the upper right of the electronic device 1600; the third antenna array 1640 may be disposed on the lower left of the electronic device 1600; and the fourth antenna array 1650 may be disposed on the lower right of the electronic device 1600.

Although not illustrated in FIG. 16, the electronic device 1600 may further include a communication circuit (e.g., the communication module 190 of FIG. 1) electrically connected to the first antenna array 1620, the second antenna array 1630, the third antenna array 1640, and the fourth antenna array 1650 through feeding lines, such as any of the previously described feeding lines.

Figure 17:
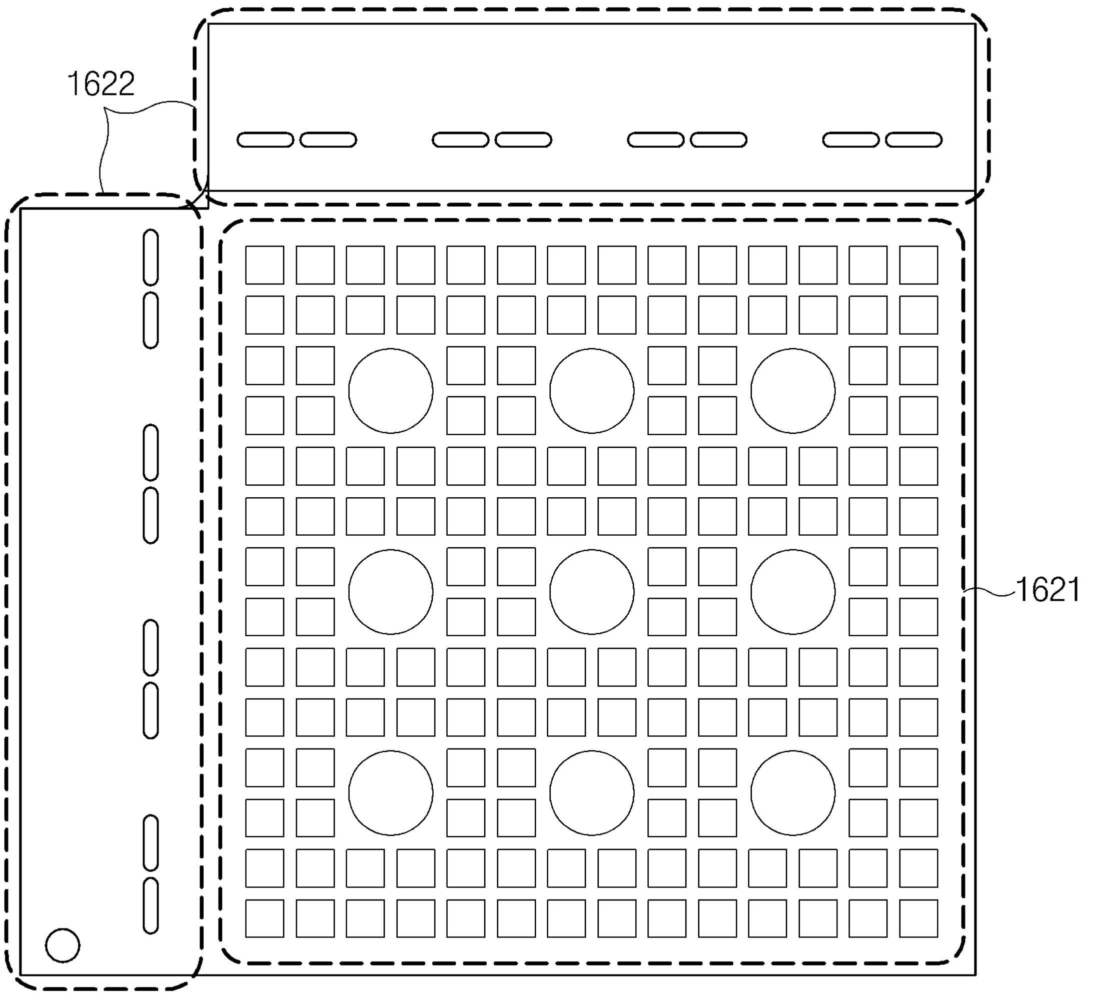
FIG. 17 is a diagram of a structure of an antenna device included in an electronic device, according to an embodiment.

FIG. 17 is a diagram of an antenna array included in an electronic device, according to an embodiment.

Referring to FIG. 17, an antenna array may include a broad-side antenna module 1621 and an end-fire antenna module 1622. The antenna array illustrated in FIG. 17 may be the first antenna array 1620 illustrated in FIG. 16. The broad-side antenna module 1621 may be the antenna device 200 illustrated in FIG. 2 or the antenna device 800 illustrated in FIG. 8. The end-fire antenna module 1622 may be disposed adjacent to the broad-side antenna module 1621. The end-fire antenna module 1622 may be disposed adjacent to a peripheral part of the electronic device. When the antenna array is disposed on the upper left of the electronic device, the end-fire antenna module 1622 may be disposed adjacent to the left-side end and the upper end of the broad-side antenna module 1621. The antenna array may transmit or receive a communication signal of 28 GHz.

Figure 18:
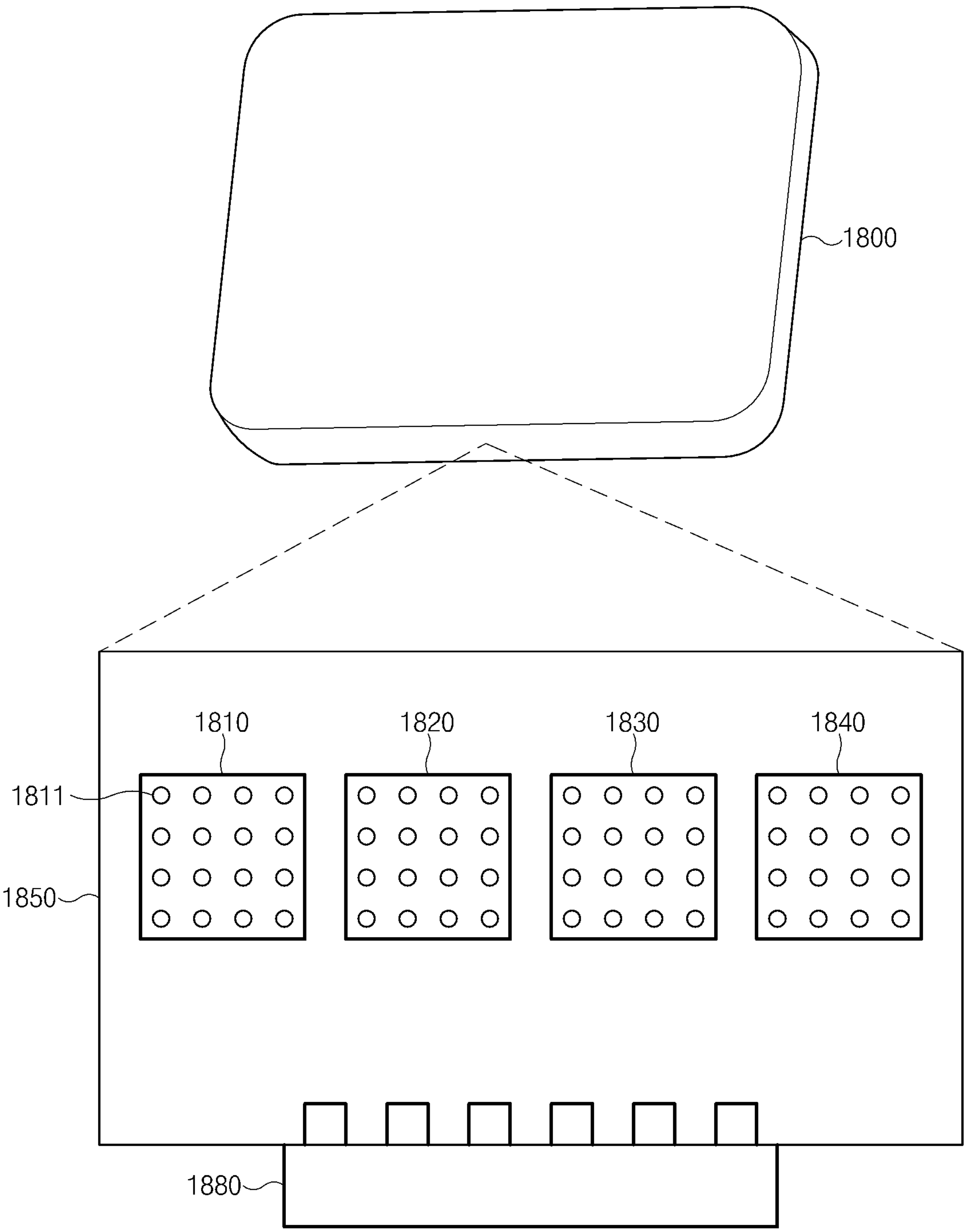
FIG. 18 is a diagram of an internal structure of an electronic device, according to an embodiment.

FIG. 18 is a diagram of an internal structure of an electronic device, according to an embodiment.

Referring to FIG. 18, an electronic device 1800 may be a base station, and the electronic device 1800 may connect a network to a mobile device positioned within the coverage of the electronic device 1800. The electronic device 1800 may include a first antenna array 1810, a second antenna array 1820, a third antenna array 1830, a fourth antenna array 1840, a PCB 1850, and a connector 1880. Each of the first antenna array 1810, the second antenna array 1820, the third antenna array 1830, and the fourth antenna array 1840 may include sixteen antenna radiators 1811 arranged in a 4×4 array. The first antenna array 1810, the second antenna array 1820, the third antenna array 1830, and the fourth antenna array 1840 may be disposed on the PCB 1850. The connector 1880 may be disposed on the PCB 1850 and may accommodate an external plug.

An antenna device may include a plurality of antenna radiators arranged in an array shape, a ground member disposed under the plurality of antenna radiators, a plurality of conductive cells arranged at a specified interval on the plurality of antenna radiators, and a plurality of feeding lines electrically connected to the plurality of antenna radiators, respectively.

The antenna device may further include a substrate including a plurality of layers. The ground member may be disposed on a first layer among the plurality of layers. The plurality of antenna radiators may be disposed on a second layer positioned above the first layer, and the plurality of conductive cells may be disposed on a third layer positioned above the second layer.

The plurality of antenna radiators may be disposed on the same plane. The ground member may be disposed in parallel with the plurality of antenna radiators, and the plurality of conductive cells may be disposed on a plane oriented in parallel to the plurality of antenna radiators.

A resonant frequency of the plurality of antenna radiators may be changed depending on a distance between the plurality of antenna radiators and the ground member and a distance between the plurality of antenna radiators and the plurality of conductive cells.

The plurality of conductive cells may be arranged to form a period structure.

A plurality of openings respectively corresponding to the plurality of antenna radiators may be formed in the period structure, and at least part of each of the plurality of antenna radiators may be exposed through each of the plurality of openings.

Two or more conductive cells may be disposed between the plurality of openings in a direction in which the plurality of openings are spaced apart from each other.

Each of the plurality of conductive cells may have a square shape.

The antenna device may further include a coupling pad disposed under a gap between the plurality of conductive cells. The coupling pad may be electrically coupled to a conductive cell adjacent to the gap.

The antenna device may further include a connection member, which is connected to two or more conductive cells adjacent to each other, from among the plurality of conductive cells.

Each of the plurality of feeding lines may be electrically connected to an end of each of the plurality of antenna radiators.

The antenna device may further include a partition formed between the plurality of antenna radiators.

The plurality of antenna radiators may be configured to transmit and receive a signal of a band including 28 GHz.

An electronic device may include a housing, an antenna array positioned inside the housing and including a plurality of antenna radiators disposed in an array shape, a ground member disposed under the plurality of antenna radiators, a plurality of conductive cells arranged at a specified interval above the plurality of antenna radiators, and a plurality of feeding lines electrically respectively connected to the plurality of antenna radiators, and a communication circuit positioned inside the housing and electrically connected to the plurality of feeding lines.

An electronic device may include a housing including a front plate, a back plate facing away from the front plate, and a side member surrounding a space between the front plate and the back plate, wherein the side member is integrally formed with or attached to the back plate, an antenna assembly including a first layer including a ground plane oriented in parallel to the back plate, a second layer including a first region including a repeating pattern of conductive islands, and a second region surrounded at least partly by the first region, when viewed from above the back plate, a third layer including a non-conductive layer interposed between the first layer and the second layer, and a first conductive pattern embedded in the third layer to overlap with the second region when viewed from above the back plate, and a wireless communication circuit positioned inside the space, and electrically connected to the first conductive pattern. The wireless communication circuit may be configured to provide a signal with a frequency range between 20 GHz and 80 GHz.

The ground plane may overlap with the first region and the second region when viewed from above the back plate.

The wireless communication circuit may be electrically connected to the first conductive pattern via an electrical path that extends through the ground plane.

The antenna assembly may further include a third region surrounded at least partly by the first region when viewed from above the back plate and a second conductive pattern embedded in the third layer to overlap with the third region when viewed from above the back plate.

The wireless communication circuit may be electrically connected to the second conductive pattern.

The first conductive pattern may include a plate having a circular shape when viewed from above the back plate.

In accordance with the disclosure, a performance of an antenna may be improved by arranging a period structure on a plurality of antenna radiators.

In accordance with the disclosure, the isolation between the plurality of antenna radiators may be improved by installing a partition between a plurality of antenna radiators.

At least a part of an apparatus (e.g., modules or functions thereof) or a method (e.g., operations) may be implemented by instructions stored in a non-transitory computer-readable storage media (e.g., the memory 130) in the form of a program module. The instruction, when executed by a processor (e.g., a processor 120), may cause the processor to perform a function corresponding to the instruction. The non-transitory computer-readable recording medium may include a hard disk, a floppy disk, a magnetic media (e.g., a magnetic tape), an optical media (e.g., a compact disc read only memory (CD-ROM) and a DVD, a magneto-optical media (e.g., a floptical disk)), an embedded memory, and the like. The one or more instructions may contain a code made by a compiler or a code executable by an interpreter.

Each element (e.g., a module or a program module) may be composed of single entity or a plurality of entities, a part of the above-described sub-elements may be omitted or may further include other elements. Alternatively or additionally, after being integrated in one entity, some elements (e.g., a module or a program module) may identically or similarly perform the function executed by each corresponding element before integration. Operations executed by modules, program modules, or other elements may be executed by a successive method, a parallel method, a repeated method, or a heuristic method, or at least one part of operations may be executed in different sequences or omitted. Alternatively, other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An antenna device comprising:
a plurality of antenna radiators arranged in an array;
a ground member disposed under with the plurality of antenna radiators;
a plurality of conductive cells arranged on the plurality of antenna radiators;
a partition on the ground member;
a plurality of feeding lines electrically connected to the plurality of antenna radiators, respectively; and
a coupling pad disposed under a gap between the plurality of conductive cells,
wherein the coupling pad is electrically coupled to a conductive cell adjacent to the gap.

2. The antenna device of claim 1, further comprising:
a substrate including a plurality of layers,
wherein the ground member is disposed on a first layer of the plurality of layers,
wherein the plurality of antenna radiators are disposed on a second layer of the plurality of layers above the first layer, and
wherein the plurality of conductive cells are disposed on a third layer of the plurality of layers above the second layer.

3. The antenna device of claim 1, wherein the plurality of antenna radiators are disposed on the same plane,
wherein the ground member is disposed on a plane parallel to the plurality of antenna radiators, and
wherein the plurality of conductive cells are disposed on a plane parallel to the plurality of antenna radiators.

4. The antenna device of claim 3, wherein a resonant frequency of the plurality of antenna radiators is changed depending on a distance between the plurality of antenna radiators and the ground member and a distance between the plurality of antenna radiators and the plurality of conductive cells.

5. The antenna device of claim 1, wherein the plurality of conductive cells are arranged to form a periodic structure including one of an artificial magnetic conductor structure or an electromagnetic bandgap structure.

6. The antenna device of claim 5, wherein a plurality of openings corresponding to the plurality of antenna radiators are formed in the period periodic structure, and
wherein at least part of each of the plurality of antenna radiators is exposed through each of the plurality of openings.

7. The antenna device of claim 6, wherein two or more conductive cells are disposed between the plurality of openings such that the plurality of openings are spaced apart from each other.

8. The antenna device of claim 1, wherein each of the plurality of conductive cells has a square shape.

9. The antenna device of claim 1, further comprising:
a connection member, which is connected to two or more adjacent conductive cells of among the plurality of conductive cells.

10. The antenna device of claim 1, wherein each of the plurality of feeding lines is electrically connected to an end of a corresponding one of the plurality of antenna radiators.

11. The antenna device of claim 1, wherein the plurality of antenna radiators are configured to transmit and receive a signal of a band including 28 GHz.

12. An electronic device comprising:
an antenna array including:
a plurality of antenna radiators disposed in an array;
a ground member in operable communication with the plurality of antenna radiators;
a plurality of conductive cells arranged above the plurality of antenna radiators;
a partition on the ground member; and
a plurality of feeding lines electrically connected to the plurality of antenna radiators,
a communication circuit electrically connected to the plurality of feeding lines, and
a connection member, which is connected to two or more adjacent conductive cells of among the plurality of conductive cells.

13. An electronic device comprising:

a housing including a front plate, a back plate, and a side member;

an antenna assembly including:

a first layer including a ground plane parallel to the back plate;

a second layer including a first region including a repeating pattern of conductive islands, and a second region surrounded at least partly by the first region;

a third layer including a non-conductive layer interposed between the first layer and the second layer;

a coupling pad disposed under a gap between the conductive islands and electrically coupled to a conductive island adjacent to the gap; and a first conductive pattern embedded in the third layer to overlap the second region; and a wireless communication circuit electrically connected to the first conductive pattern.

14. The electronic device of claim 13, wherein the ground plane overlaps with the first region and the second region.

15. The electronic device of claim 13, wherein the wireless communication circuit is electrically connected to the first conductive pattern via an electrical path that extends through the ground plane.

16. The electronic device of claim 13, wherein the antenna assembly further includes:

a third region surrounded at least partly by the first region; and a second conductive pattern embedded in the third layer to overlap with the third region.

17. The electronic device of claim 16, wherein the wireless communication circuit is electrically connected to the second conductive pattern.

18. The electronic device of claim 13, wherein the first conductive pattern includes a plate having a circular shape.

19. The antenna device of claim 1, wherein the partition surrounds at least a part of each of the plurality of antenna radiators, and wherein a height of the partition is greater than a distance between the plurality of antenna radiators and the ground member.

20. The electronic device of claim 13, wherein the wireless communication circuit is configured to provide a signal with a frequency range between 20 GHz and 80 GHz.

* * * * *